United States Patent [19]

Ihara

[11] Patent Number: 4,677,745
[45] Date of Patent: Jul. 7, 1987

[54] APPARATUS FOR AUTOMATICALLY MOUNTING SPECIAL-TYPE CHIPS ON SUBSTRATE

[75] Inventor: Keiichi Ihara, Tokyo, Japan

[73] Assignee: TDK Corporation, Tokyo, Japan

[21] Appl. No.: 741,305

[22] Filed: Jun. 4, 1985

[30] Foreign Application Priority Data

| Jun. 7, 1984 | [JP] | Japan | 59-84548[U] |
| Jul. 17, 1984 | [JP] | Japan | 59-107937[U] |
| Jul. 26, 1984 | [JP] | Japan | 59-113790[U] |
| Jul. 26, 1984 | [JP] | Japan | 59-113791[U] |
| Sep. 4, 1984 | [JP] | Japan | 59-183676 |
| Sep. 24, 1984 | [JP] | Japan | 59-143977[U] |
| Sep. 24, 1984 | [JP] | Japan | 59-143978[U] |
| Apr. 15, 1985 | [JP] | Japan | 60-54708[U] |
| May 20, 1985 | [JP] | Japan | 60-73513[U] |

[51] Int. Cl.$^4$ ............................................. B23P 19/00
[52] U.S. Cl. ............................................. 29/741; 29/837
[58] Field of Search ............................... 29/741, 837

[56] References Cited

U.S. PATENT DOCUMENTS

| 3,545,064 | 12/1970 | Zemek et al. | 29/741 X |
| 4,051,593 | 10/1977 | Mori et al. | 29/741 X |
| 4,161,064 | 7/1979 | Woodman, Jr. et al. | 29/741 |
| 4,196,513 | 4/1980 | Harigane et al. | 29/837 X |
| 4,293,998 | 10/1981 | Kawa et al. | 29/741 X |
| 4,387,506 | 6/1983 | Wright et al. | 29/741 X |
| 4,422,232 | 12/1983 | Vancelette et al. | 29/741 X |

FOREIGN PATENT DOCUMENTS 80512 6/1983 European Pat. Off. ............... 29/741

Primary Examiner—Howard N. Goldberg
Assistant Examiner—Carl J. Arbes
Attorney, Agent, or Firm—Frishauf, Holtz, Goodman & Woodward

[57] ABSTRACT

An apparatus for automatically mounting special-type chips on a substrate which is capable of individually and successively mounting special-type chips on a substrate at a high speed. The apparatus comprises a chip feed and removing mechanism for individually and successively feeding chips to a chip fitting mechanism, the chip fitting mechanism including a single mounting head and adapted to accurately position terminal pins of a chip with respect to a substrate, and a chip terminal clinching mechansim for cutting and bending the terminal pins to securely mount the chip on the substrate.

17 Claims, 38 Drawing Figures

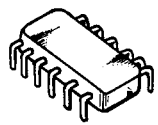
Fig. 1
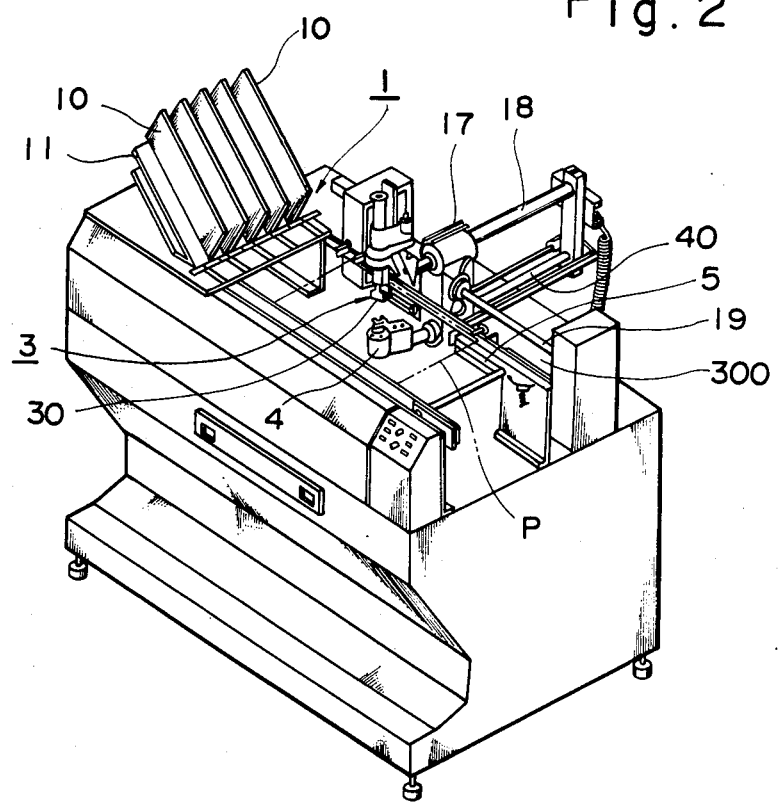
Fig. 2

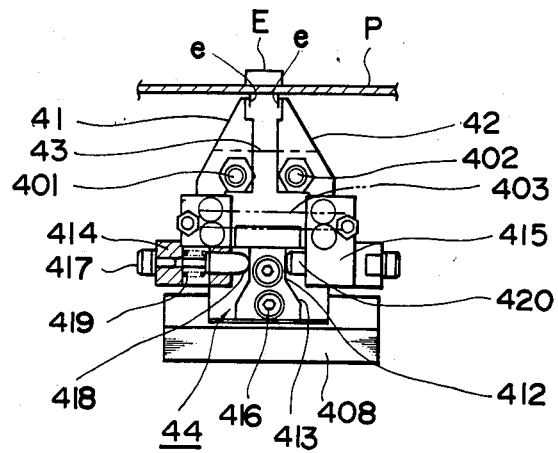
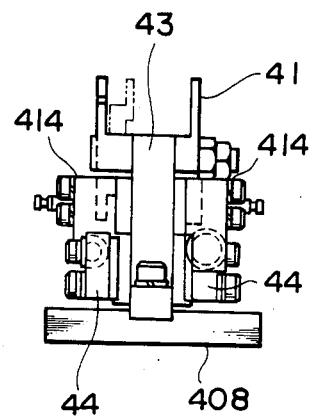
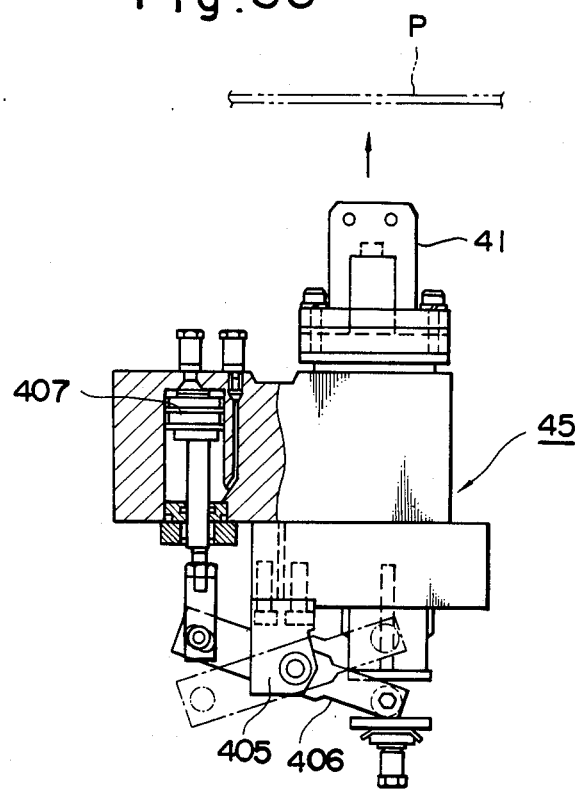

APPARATUS FOR AUTOMATICALLY MOUNTING SPECIAL-TYPE CHIPS ON SUBSTRATE

BACKGROUND OF THE INVENTION

1. Field of the Invention

This invention relates to an apparatus for automatically mounting electronic components on a substrate, and more particularly to an automatic mounting apparatus for the mounting of chip-type circuit elements of the special-type such as IFT, DiPIC, a semifixed resistor or the like on a substrate for a printed circuit board.

2. Description of the Prior Art

Conventionally, the automatic fitted mounting of a chip-type circuit element of the special-type such as IFT, DiPIC (Dual-in-line Packaging Integrated Circuit Component), a semifixed resistor or the like (hereinafter referred to as "special-type chip" or "chip") on a substrate such as that for a printed circuit board has been typically carried out in a manner such that a magazine in which a plurality of chips arranged in a row are received is transferred to a position at which the chip is to be fittedly mounted on a substrate by means of an X-Y table and then a mounting head receives a chip fed from the magazine and mounts it on the substrate.

Although such a conventional procedure does not cause any important problem in the operation of sequentially mounting on a substrate only one kind of chips taken out from a single magazine, difficulties are encountered when various kinds of chips fed from a plurality of magazines respectively receiving therein chips which are different in kind from each other are to be mounted on a single substrate. This is because an X-Y table in such an apparatus for transferring each of the magazines to the mounting position must be highly complicated in construction, and it is substantially impossible to carry out the mounting operation with a high speed. In addition, such a chip feed mechanism is not suitable for rapid mounting because it is required to individually separate chips received in the magazine in order to individually and successively transfer the chips to the position of a mounting head, resulting in much time being necessary. Also, the feed mechanism fails to accomplish the constant individual and successive feeding of chips.

Further, a plurality of magazines each having a plurality of special-type chips received therein have been vertically arranged in a cartridge in order to ensure that the mounting operation is successively carried out for a long period of time. This exhibits another advantage of reducing needed space for installation. However, such arrangement requires that empty magazines are rapidly discharged from the cartridge when they are to be replaced with chip charged magazines. Also, in order to discharge the empty magazines without hindering the mounting operation, it is desired to employ a structure which allows the emtpy magazines to be prearranged in the cartridge prior to the discharge.

Also, a conventional automatic mounting apparatus is so constructed that the picking-up of a chip by a mounting head is carried out through a chuck or vacuum nozzle mounted on the lower end thereof and the mounting of the chip on a substrate is carried out by vertically moving the chuck or vacuum nozzle by means of an actuation cylinder of the mounting nozzle. However, a special-type chip unfortunately has a plurality of terminal pins mounted on the lower end thereof. Thus, the holding of the special-type chip by the conventional chuck or vacuum nozzle is not sufficient to mount the chip on a substrate because it is highly difficult to position the terminal pins with respect to the corresponding through-holes of the substrate, and the terminal pins hinder the smooth mounting. This requires a centering mechanism for accurately positioning the terminal pins with respect to the substrate.

Furthermore, the fitting of terminal pins of a special-type chip in a substrate during the chip mounting operation has been confirmed using a detecting device which is generally constructed in a manner such that positive and negative terminal pins of a chip are interposed between a pair of benders provided at the opposite upper ends of the device and voltage is applied across the chip between the benders, so that a success in application of the voltage indicates the fitting of terminal pins of the chip in the substrate and a failure in the application indicates the misfitting. However, the detecting mechanism of such construction requires the adjustment of applied voltage because the voltage to be applied must be determined depening upon the capacity of a chip.

SUMMARY OF THE INVENTION

The present invention has been made in view of the foregoing disadvantages of the prior art.

Generally speaking, in accordance with the present invention, an apparatus is provided for automatically mounting special-type chips on a substrate which comprises a chip feed and removing mechanism for individually and successively feeding special-type chips which includes a plurality of cartridges obliquely arranged in a row each carrying a plurality of magazines therein each of which have special-type chips received therein, a stopper for stopping each of special-type chips successively slipping down by gravity from the magazines received in each of the inclined cartridges, and a chip transfer device arranged at the lower end of each of the inclined cartridges to obliquely receive each of special-type chips held by the stopper, each of the chip transfer devices being vertically biased and horizontally moved to transfer a special-type chip to a predetermined position according to a predetermined program; a chip fitting mechanism including a single mounting head positioned perpendicular to the moving direction of each chip transfer device and moved to the chip transfer position of each transfer device by means of an X-Y table to receive a special-type chip and a push rod for forcing a special-type chip held between the lower end of guide arms of the mounting head when the chip is to be mounted on a substrate due to the downward movement of the mounting head; and a chip terminal clinching mechanism for carrying out the cutting and bending off terminal pins of a special-type chip from the substrate.

In a preferred embodiment of the present invention, each of the chip transfer devices includes a clamp for receiving and holding in order special-type chips slipping down from each of the magazines and stopped by the stopper; a first support frame arranged in a manner to be inclined corresponding to the inclination of each of the cartridges and on which the clamp is mounted; a cam plate engaged through a cam follower with the support frame; a reciprocating drive cylinder connected to the cam plate; a second support frame on which the cam plate is slidably held; the second support frame being arranged to be moved in the same direction as the drive cylinder by means of a guide bar; whereby the actuation of the drive cylinder forward moves the cam plate together with the second support frame to cause the cam follower to horizontally bias the first support frame, to thereby transfer special-type chips held by the clamp to the mounting head in order.

In a preferred embodiment of the present invention, the chip feed and removing mechanism includes a chute inclinedly arranged at an outlet of each of the cartridges to receive special-type chips slipping down thereonto from the cartridges; a clamp mounted on the side of each of the chutes and adapted to secure special-type chips except the foremost one; and each of the chip transfer devices which includes a base arranged in alignment with the lower end of the chute to receive only the foremost chip, the stopper being frequentedly mounted on the front surface of the base, and a holding arm releasably arranged on the side of the base to support special-type chips; the base being biased from the inclined position to the horizontal position and moved to the waiting position of the mounting head.

In a preferred embodiment of the present invention, the chip feed and removing mechanism includes a chute provided to constitute a chip passage communicated with each of the cartridges; and each of the chip transfer devices which includes a chip holder tiltably provided to receive therein a special-type chip from the chute, and chip clamping means for clamping a special-type chip received in the chip holder and stopper means for positioning terminal pins of a special-type chip, the chip clamping means and stopper means being arranged on the chip holder. The cartridges and chutes may be inclined at an angle of about 45 degrees with respect to the horizontal plane.

In a preferred embodiment of the present invention, the apparatus further comprises a device for automatically replacing magazines comprising a first stock means for receiving chip charged magazines therein and a second stock means for receiving empty magazines therein which are formed in each of the cartridges; and a first pusher or laterally transferring the empty magazines dropped from the first stock means and a second pusher for vertically transferring the empty magazines to the second stock means, the first and second pushers being arranged below the cartridge. The first and second pushers each are adapted to be moved due to the engagement of a cam groove at a slide plate reciprocated by a drive cylinder with a cam follower. Also, the first and second pushers are arranged to carry out their predetermined operation along cam grooves different in shape due to the reciprocating movement of a slide plate by a single drive cylinder.

In a preferred embodiment of the present invention, the mounting head of the chip fitting mechanism further comprises a support frame; and a drive cylinder connected to the upper end of each of the guide arms to operate the lower ends of the guide arms; the guide arms being pivotally mounted on the support frame by means of a pin; the push rod being vertically movably arranged between the guide arms to press a special-type chip against a substrate. The lower end of each of the guide arms has a shape engaged with the corner portion of a special-type chip so that the chip may be securely interposed at the opposite corners thereof between the lower ends of the guide arms. The guide arms may be replaceably mounted. Alternatively, the lower end of each of the guide arms may be formed on the inner surface thereof with a groove for receiving the side portion of a special-type chip so that the chip may be securely interposed at the opposite side portions between the lower ends of the guide arms.

In a preferred embodiment of the present invention, the mounting head of the chip fitting mechanism further comprises drive cylinders for operating the lower ends of the guide arms to moves toward and away from each other; the push rod being movably arranged between the guide arms for vertical movement; one of the guide arms having a lower end portion formed with at least one groove for positioning at least one terminal pin downward extending from one side of a special-type chip therein and the other guide arm having a lower end portion formed with at least one groove for positioning at least one terminal pin downward extending from the opposite side of the chip therein.

In a preferred embodiment of the present invention, the chip terminal clinching mechanism comprises a pair of benders pivotally mounted on a support means to be opposite to each other; a cam means arranged to be squeezed between the lower ends of the benders to cause the upper ends of the benders to carry out at least the operation of bending terminal pins of a special-type chip; a first terminal mounted on the cam means to act as one electrode and a second terminal mounted on the lower end of each of the benders through an insulator to act as the other electrode; and a detection pin provided to be releasably contacted with the second terminal, the detection pin being elastically biased through the insulator toward the cam means to be abutted against the cam means when the cam means is at the squeezing position.

Accordingly, it is an object of the present invention to provide an apparatus for automatically mounting special-type chips on a substrate which is capable of efficiently carrying out the individual and successive mounting of various kinds of chips on substrates at a high speed.

It is another object of the present invention to provide an apparatus for automatically mounting special-type chips on a substrate which is capable of positively fitting terminal pins of a chip in a substrate.

It is another object of the present invention to provide an apparatus for automatically mounting special-type chips on a substrate which is capable of accomplishing the individual and successive feeding and removing of chips.

It is another object of the present invention to provide an apparatus for automatically mounting special-type chips on a substrate which is capable of accurately carrying out the positioning of terminal pins of a chip with respect to a substrate irrespective of the configuration and dimensions of a chip to be mounted.

It is a further object of the present invention to provide an apparatus for automatically mounting special-type chips on a substrate which is capable of accurately accomplishing the fitting of terminal pins of a chip in a substrate.

It is a further object of the present invention to provide an apparatus for automatically mounting special-type chips on a substrate which is adapted to efficiently attain the chip mounting operation and keep the working environment in good order.

It is still a further object of the present invention to provide an apparatus for automatically mounting special-type chips on a substrate which is capable of readily carrying out the positioning of a chip with respect to a substrate.

It is yet a further object of the present invention to provide an apparatus for automatically mounting special-type chips on a substrate which is effectively accomplishing the detection of fitting of a chip with respect to a substrate.

Still other objects of the present invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1 is a perspective schematic view showing examples of a special-type chip treated by an apparatus for automatically mounting special-type chips on a substrate according to the present invention;

FIG. 2 is a perspective view generally showing an embodiment of an apparatus for automatically mounting special-type chips on a substrate according to the present invention;

FIG. 33 is a side elevation view showing a part of a chip clinching mechanism having means for detecting the insertion of terminal pins of a chip into a substrate incorporated therein;

FIG. 34 is a front elevation view of the chip clinching mechanism shown in FIG. 33;

FIG. 35 is a general view of the chip clinching mechanism shown in FIG. 33;

DETAILED DESCRIPTION OF THE PREFERRED EMBODIMENTS

Now, an apparatus for automatically mounting special-type chips on a substrate according to the present invention will be described hereinafter with reference to the accompanying drawings.

FIG. 2 generally illustrates an embodiment of an automatic mounting apparatus according to the present invention. An apparatus of the illustrated embodiment is adapted to individually and successively mount special-type chips having a plurality of terminal pins as shown in FIG. 1, for example, such as an IFT, a Dual-in-line Packaging Integrated Circuit Component, a semifixed resistor or the like on a substrate for a printed circuit board and generally comprises a chip feed and removing mechanism 1, a chip fitting mechanism 3 and a chip clinching mechanism 4. Also, the automatic mounting apparatus of the illustrated embodiment is adapted to intermittently feed a substrate P in the horizontal direction by means of a conveyor 5 and fittedly mount chips on the substrate P in position during the intermittent transportation of the substrate.

Figure 3:
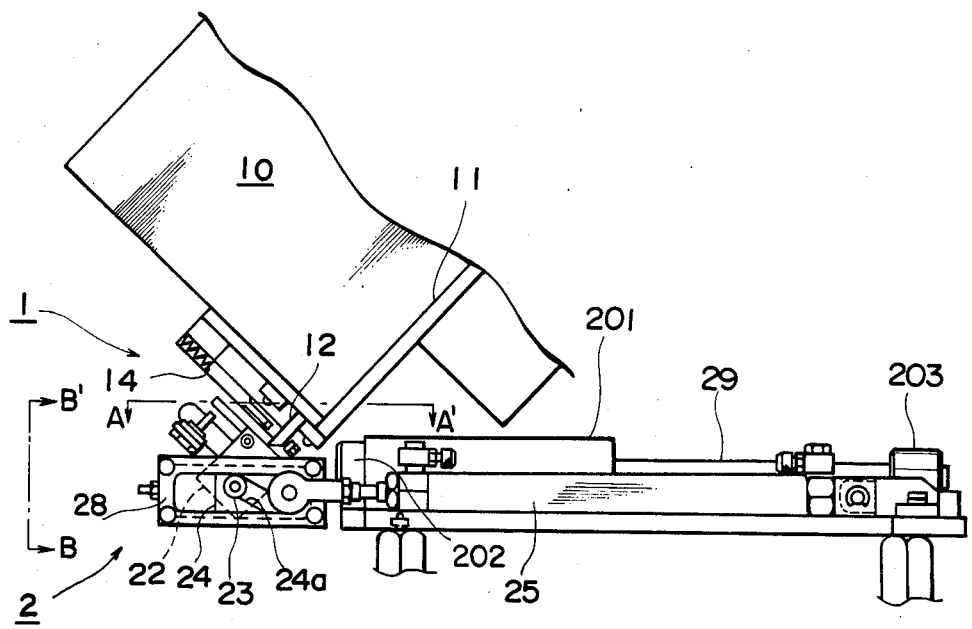
FIG. 3 is a side elevation view showing a chip feed and removing mechanism incorporated in the automatic mounting apparatus shown in FIG. 2.
Figure 4:
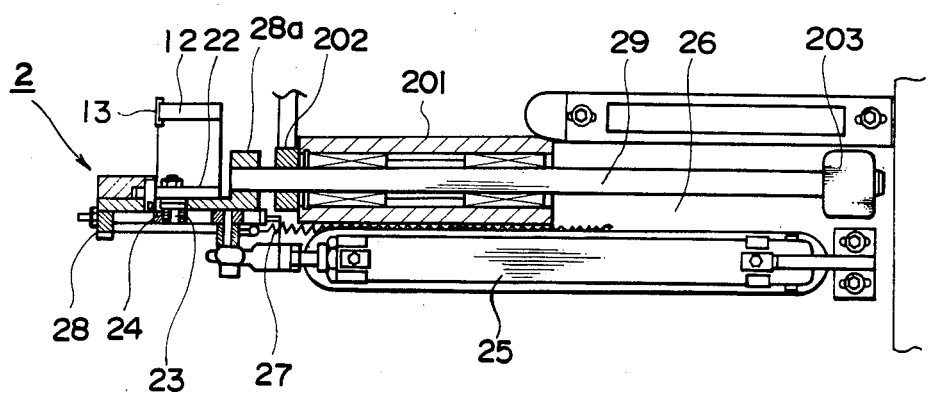
FIG. 4 is a partially cutaway plan view of the chip feed and removing mechanism shown in FIG. 3.

The chip feed and removing mechanism 1 of the apparatus includes a plurality of cartridges 10 arranged in a row each carrying a plurality of magazines therein each of which have special-type chips received therein, and a plurality of chip transfer devices 2 being constructed in the same manner which are arranged positionally corresponding to the cartridges 10. The cartridges 10, as shown in FIG. 2, are arranged on a base 11 obliquely arranged at an angle of about 45 degrees with respect to the horizontal plane of the body of the automatic mounting apparatus to allow special-type chips to successively slip down from an opening of lowermost one of the magazines received in each of the cartridges 10 by gravity, to thereby feed the chip in order. The chip feed and removing mechanism 1, as shown in FIGS. 3 and 4, also includes a chute 12 obliquely arranged below each of the cartridges 10 to permit a chip to slip down thereonto and a stopper 13 provided at the lower end of the chute 12 to stop a chip slipping down onto the chute 12. Arranged at the intermediate section of the chute 12 is a shutter 14 which acts to stop the subsequent special-type chips to individually and progressively feed the chips to the stopper 13.

Figure 5:
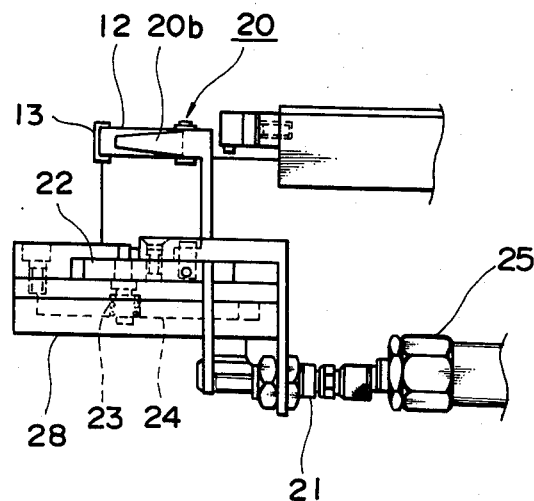
FIG. 5 is a fragmentary plan view and showing a part of the chip feed and removing mechanism taken along line A-A' of FIG. 3.
Figure 6:
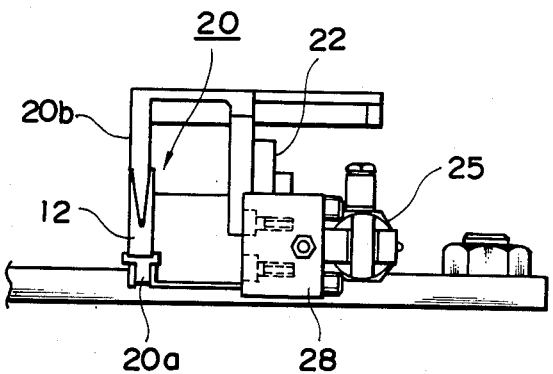
FIG. 6 is a fragmentary front view taken along line B-B' of FIG. 3.

The chip transfer device 2 each includes a transfer clamp 20 arranged positionally corresponding to the cartridge 10 so as to individually and successively receive and clamp chips held by the stopper 13 provided at the end portion of clamp 20 to prevent the chip from falling off clamp 20, as schematically shown in FIGS. 5 and 6. stopper 13 is normally biased downwardly (by means not shown) but is forced upwardly (by means not shown) when clamp 20 is placed in its position at chute 12. The clamp 20 each comprises a receiving jaw member 20a and a holding arm member 20b which are vertically arranged opposite to each other and adapted to releasably hold a chip in a manner to clamp it between the members 20a and 20b by vertically actuating the holding arm member 20b by means of a drive cylinder 21. The jaw member 20a and arm member 20b are arranged to laterally project from a support plate 22 toward the chute 12. The support plate 22 is biased by a spring means (not shown) such as a torsion coiled spring or the like to maintain the jaw member 20a and arm member 20b of the clamp 20 angularly parallel to the chute 12 obliquely arranged below each of the cartridges 10. Also, the support plate 22 is connected through a cam follower 23 mounted on the side thereof to a cam plate 24. The cam plate 24 is formed with a cam groove 24a which is inclined in the direction opposite to the obliquely biased direction of the support plate 22 and engaged with the cam follower 23 of the support frame 22. On the cam plate 24 is pivotally supported the end of a rod of a reciprocating drive cylinder 25. Also, the cam plate 24 is suppported in a support frame 28 to slide by a predetermined distance against a tension spring 27 stretched between the cam plate 24 and a body 26 due to the actuation of the drive cylinder 25. The support frame 28 is adapted to be reciprocated together with the cam plate 24 by the actuation of the drive cylinder 25, and a guide bar 29 for guiding such movement of the support frame 28 is fixed in a bracket 28a formed integrally with the support frame 28. The guide bar 29 is supported in a slide housing 201 inserted in the body 26 and provided at both ends thereof with stopper rings 202 and 203 which abut against the housing 201 to regulate the reciprocating movement of the guide bar 29.

In the chip transfer device 2 of the chip feed and removing mechanism 1, the clamps 20 are reciprocated in the direction parallel to the direction in which the conveyor 5 intermittently feeds a substrate P due to the actuation of the drive cylinders 25. The chip fitting mechanism 3 briefly described above is provided at the position perpendicular to the direction of movement of the clamp 20, as shown in FIG. 2.

Now, the manner of operation of the chip feed and removing mechanism 1 constructed as described above will be described hereinafter with reference to FIGS. 3 to 6.

In the chip feed and removing mechanism 1, the clamp 20 of each of the chip transfer devices 2 is adapted to extract a chip from the magazine within any one of the cartridges 10 arranged in a row and alternately selectively move the clamp 20 to a predetermined position in the horizontal direction by means of the drive cylinder 25. More particularly, when a chip slips down from the magazine of a desired one of the cartridges 10 onto the chute 12, it is held by the stopper 13 which is forced upwardly when clamp 20 is at chute 12. Drive cylinder 21 is then actuated to operate the holding member 20b of the clamp 20 to clamp therebetween the chip positioned on the chute 12. Concurrently, the drive cylinder 25 is actuated to extend its rod to move the clamp 20 toward the mounting head 30 of the chip fitting mechanism 3. At the initial stage of such forward movement, the cam plate 24 gradually slides within the support frame 28 against the tension spring 27 to rotate the support plate 22 from the inclined position to the horizontal position while gradually lowering it, so that the chip may be removed from the chute 12 by the clamp 20 of which the jaw member 20a and holding arm 20b hold it therebetween. At this time, the stopper 13 has dropped downward to be released from the chip and the shutter 14 is moved downward to prevent the next chip from slipping down onto the chute 12. When the clamp 20 removes the chip from the chute 12, the support plate 22 is rendered substantially horizontal in the support frame 28 and the cam plate 24 is moved to the forward position within the range of sliding movement of the support frame 28. When the forward movement of the cam plate 24 within the support frame 28 is completed, the support frame 28 is moved with the cam plate 24 to cause the clamp 20 to be moved to the waiting position of the mounting head 30 while horizontally holding the chip between the jaw member 20a and holding arm 20b thereof. When the clamp 20 reaches the waiting position of the mounting head 30 in which the chip secured in clamp 20 is inserted in the space between guide arms 31 and 32 of mounting head 30, the stopper 203 of the guide bar 29 comes into abutment against the slide housing 201. As a result, the holding arm 20b is vertically actuated to release the chip from the holding of the clamp 20 due to the actuation of the drive cylinder 21. The chip is transferred to the mounting head 30 from the clamp 20 as guide arms 31, 32 grasp the chip. When the chip is transferred to the mounting head 30, the drive cylinder 25 is immediately actuated to retract its rod to cause the stopper 202 to be abutted against the slide housing 201. Thereafter, the cam plate 24 is moved within the support frame 28 by means of the tension spring 27 and stopped when the stopper 202 is abutted against the body 26. At this time, in the chip feed and removing mechanism 1, the shutter 14 is moved upward to allow the next chip to slip down onto the chute 12, which is held by the clamp 20 until the drive cylinder 25 receives a command.

FIGS. 7 to 14 illustrate a modification of the chip feed and removing mechanism 1.

A chip feed and removing mechanism of FIGS. 7 to 14 is adapted to individually and successively feed special-type chips to the chip fitting mechanism 3.

Figure 7:
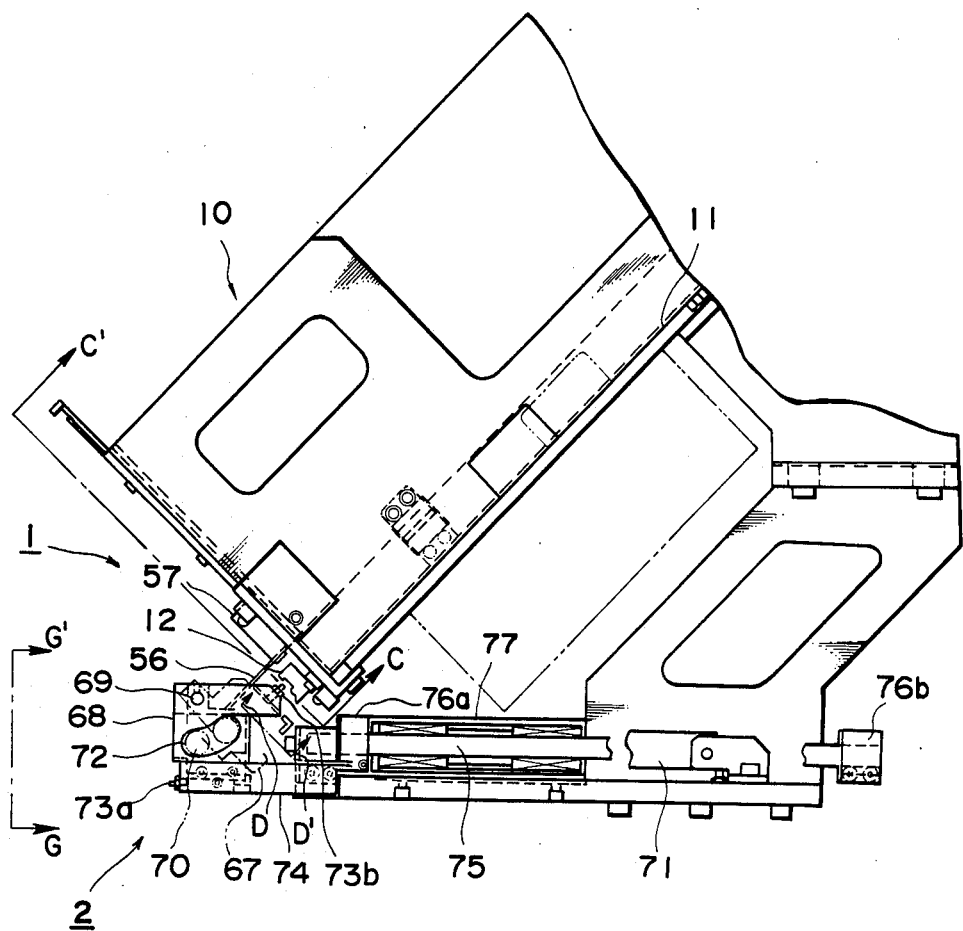
FIG. 7 is a side elevation view showing a modification of the chip feed and removing mechanism shown in FIG. 3.
Figure 8:
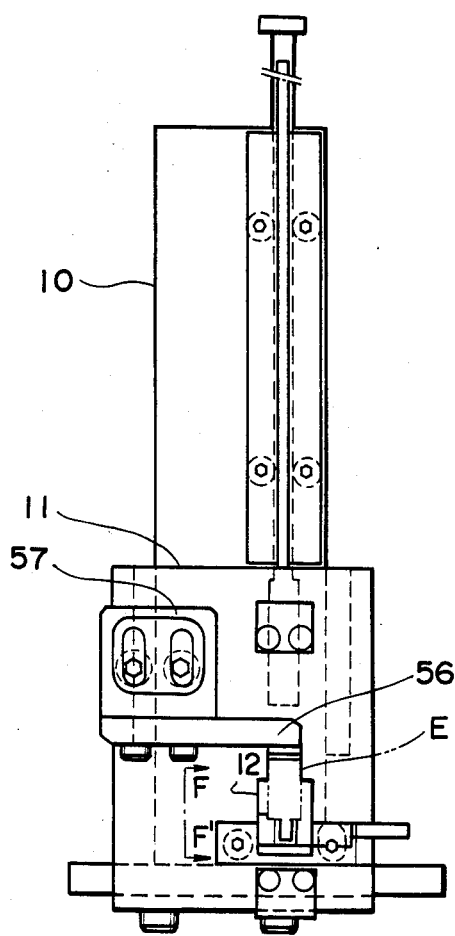
FIG. 8 is a front elevation view of the chip feed and removing mechanism taken along line C-C' in FIG. 7.
Figure 9:
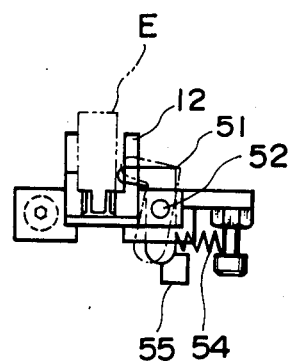
FIG. 9 is a fragmentary front elevation view showing a chute used in the chip feed and removing mechanism along line D-D' in FIG. 7.
Figure 10:
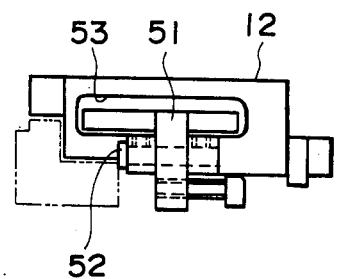
FIG. 10 is a side elevation view of the chute shown in FIG. 9.

In the chip feed and removing mechanism 1 of FIGS. 7 to 14, a chute 12 arranged every cartridge 10 in a manner to be inclined at substantially the same angle as the mounting angle of the cartridge 10, as shown in FIG. 7. At the lower end of each of the chutes 12 a chip transfer device 2 is arranged. The chute 12 is formed into a U-shape in section and constructed to receive therein a plurality of chips in a row which successively slip down from the cartridge 10 thereonto. The chute 12, as shown in FIGS. 9 and 10, is provided at the side thereof with a clamp 51 for pressing chips except the lowermost one received in the chute 12. The clamp 51 is pivotally mounted on the side of the chute 12 by means of a pin 52 and inserted at the upper portion thereof through an opening 53 into the chute 12. Also, the clamp 51 is biased at the lower portion thereof by a tension spring 54 to cause the tip end of the upper portion thereof inserted into the chute 12 to be forced into abutment against the chip. Positioned at the lower end of the clamp 51 is a clamp actuating cam 55, which is actuated by a drive cylinder (not shown). The clamp actuating cam 55 as it moves is adapted to be abutted against the lower end of the clamp 51 to cause the clamp 51 to be pivotally retracted against the force of spring 54. Above the chute 12 is provided a guide arm 56 which serves to apply a forced downward on each of the chips successively slipping down onto the chute 12 by pressing downward on the head portion of each chip to keep it from sliding down chute 12. The guide arm 56 is arranges to project from a support frame 57 vertically movable connected to the front portion of the base 11.

Figure 11:
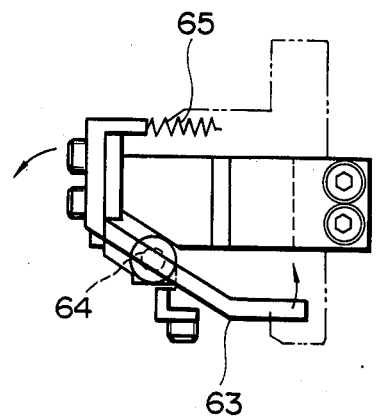
FIG. 11 is a side elevation view showing an upward pushing lever of a holding arm mounted on a base.
Figure 12:
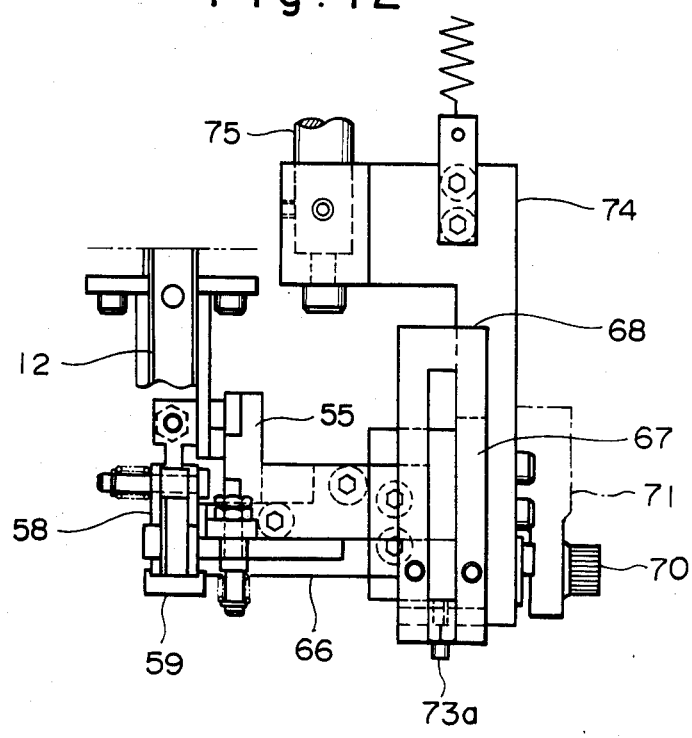
FIG. 12 is a fragmentary plan view of parts mounted to the left side of base 74 shown in FIG. 7.
Figure 13:
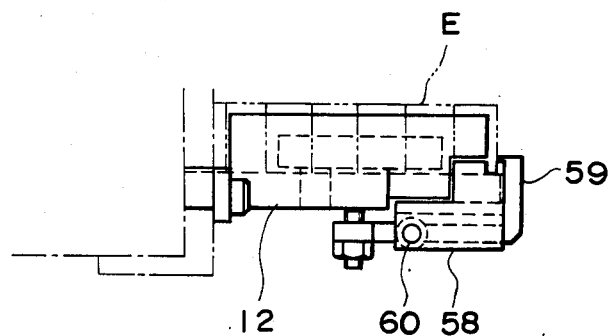
FIG. 13 is a fragmentary side elevation view along the line F-F' of FIG. 8.
Figure 14:
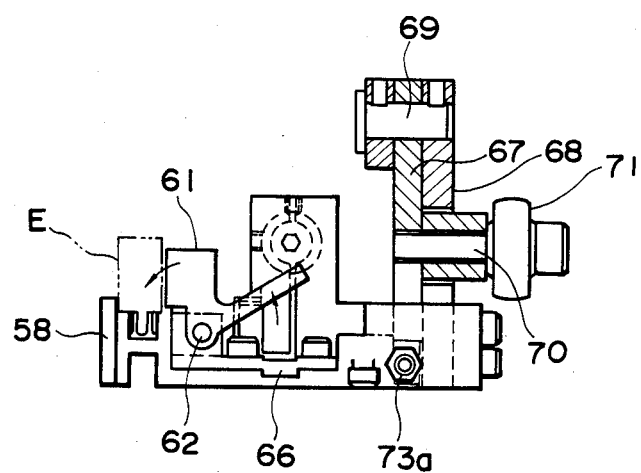
FIG. 14 is a front view along line G-G' of FIG. 7.
Figure 15:
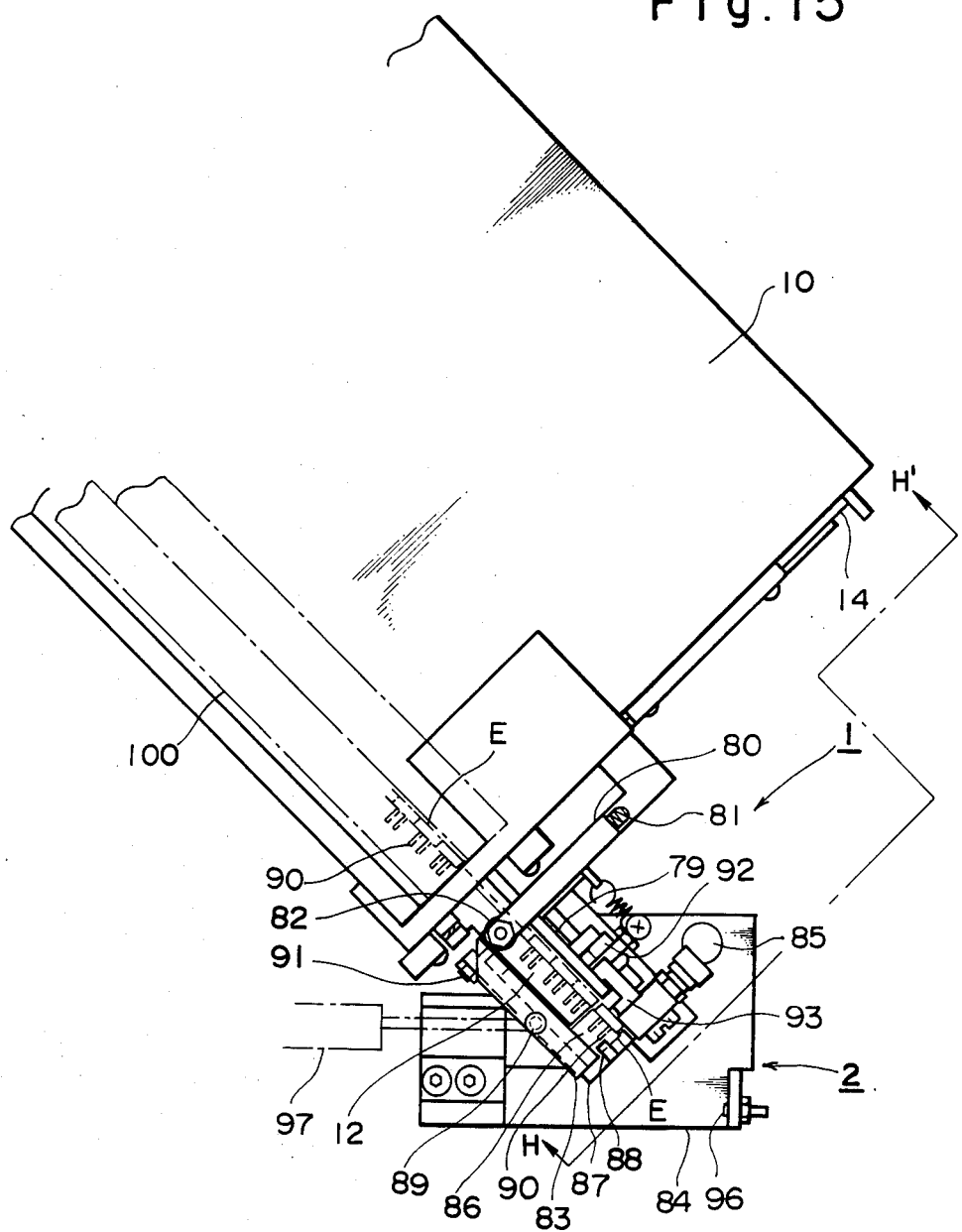
FIG. 15 is a further modification of the chip and removing mechanism shown in FIG. 7.
Figure 16:
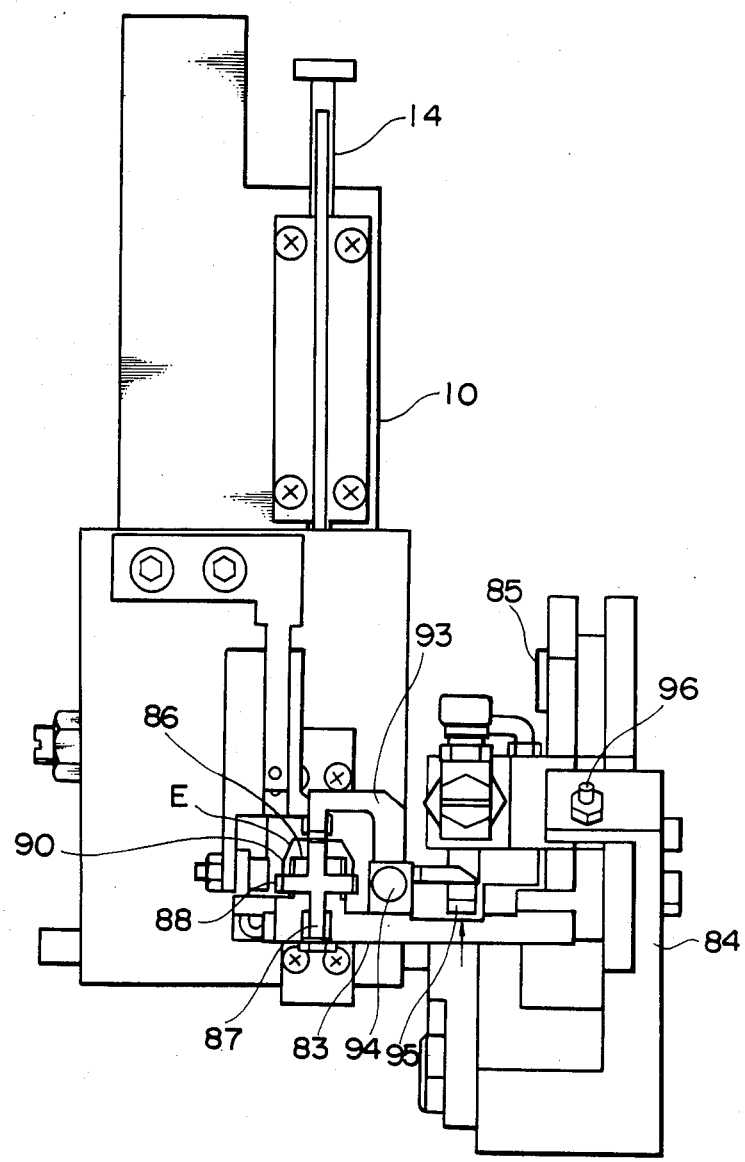
FIG. 16 is a front elevation view of the chip feed and removing mechanism taken along line H-H' in FIG. 15.

The chip transfer device 2 each includes a chip receiving member 58 arranged at the lower end of each of the chutes 12, which is formed into substantially the same shape as the chute 12 or a U-shape, as shown in FIGS. 12 and 14. The chip receiving member 58 serves to receive therein the lowermost one of the chips slipping down onto the chute 12. The chip receiving member 58 is provided at the front portion thereof with a stopper 59 for stopping a chip received in the member 58. The stopper 59 is pivotally mounted on the receiving member 58 by means of a pin 60. Stopper 59 is urged upward by a torsion spring (not shown) mounted on the pin 60. Also, the stopper 59 is adapted to be biased by means of a tension spring (not shown) to be retracted downward about the pin 60 when the chip is to be transferred to a mounting head as described hereinafter. Further, the chip receiving member 58 is provided on the side thereof with a holding arm 61 (FIG. 14). The holding arm 61 is pivotally mounted on the chip receiving member 58 by means of a pin 62 and is adapted to be constantly biased by means of a torsion coiled spring (not shown) mounted on the the pin 62 to be retracted. In the proximity of the rear end of the holding arm 61 is provided an upward pushing lever 63 (FIG. 11). The lever 63 is oscillated about a pin 64 by means of a drive cylinder (not shown) and adapted to allow the lower arm portion thereof to be abutted against the rear end of the holding arm 61 in the direction perpendicular thereto. Also, the upward pushing lever 63 is adapted to allow the upper arm portion thereof to be under tension of a tension spring 65 to prevent the lower arm portion thereof from being abutted against the holding arm 61 when the drive cylinder is stopped.

The chip receiving member 58 is adapted to be deflected in the horizontal direction from the chute 12 and, for this purpose, it is connected through a connecting plate 66 to an oscillating plate, 67 as shown in FIGS. 12 and 14. The oscillating plate 67 connected to the chip receiving member 58 is eccentrically mounted on a vertical plate 68 by a pin 69 about which it can pivot. One end of guide pin 70 is connected to plate 67 while its other end rides in cam groove 72. Plate 68 is coupled to a drive cylinder 71. The drive cylinder 71 is horizontally arranged and adapted to be reciprocated so as to move the chip receiving member 58 to the waiting position of a mounting head described below. The oscillating plate 67 is adapted to be oscillated about the pin 69 along a cam groove 72 (FIG. 7) with the actuation of the drive cylinder 71 and the resultant movement of plate 68. The upper and lower dead points of oscillation of the oscillating plate 67 are determined by stoppers 73a and 73b provided on the vertical plate 68.

The vertical plate 68 is mounted on a base plate 74 which is arranged to be horizontally moved by means of a guide bar 75 as shown in FIG. 7. The guide bar 75 has stopper rings 76a and 76b fitted on the front and rear ends thereof, which are adapted to be abutted against the front and rear end surfaces of slide housing 77 to regulate the stroke of the drive cylinder 71.

Now, the manner of operation of the chip feed and removing mechanism of FIGS. 7 to 14 constructed in the manner described above will be described hereinafter.

The chute 12 receives chips slipping down by gravity from magazines of a corresponding cartridge 10, and the receiving member 58 of the chip transfer device 2 positioned at the lower end of the chute 12 to be aligned therewith receives only the lowermost one of the chips received in the chute 12 and holds it therein by means of the stopper 59. Then, when the chip is to be selectively transferred to a mounting head 30 by the receiving member 58, the cylinder 71 is actuated by a suitable command to move the receiving member 58 away from the chute 12. At this time, the clamp 51 is partially inserted at the upper portion thereof into the opening 53 of the chute 12 to hold the subsequent chips received in the chute 12 in cooperation with the guide arm 56, so that the subsequent chips are prevented from slipping down into the receiving member 58. Also, the stopper 59 holds in the receiving member 58 the chip received therein, and the upward pushing lever 63 adapted to be pivotally moved about the pin 64 by the drive cylinder (not shown) deflects the holding arm 61 to secure the chip in the member 58.

When the drive cylinder 71 starts to be actuated to move plate 68, the oscillating plate 67 is oscillated about the pin 69 along the cam groove 72 of the vertical plate 68 to move the chip receiving member 58 from the inclined position to the horizontal position. Such movement of the chip receiving member 58 is stopped when the oscillating plate 67 is abutted against the stopper 73a of the vertical plate 68, so that the chip receiving member 58 is horizontally held. When the oscillating plate 67 is abutted against the stopper 73a, these components are moved together with the base plate 74 toward the chip fitting mechanism 3. Such movement is stopped when the stopper ring 76a of the guide bar 75 is abutted against the rear end surface of the slide housing 77, at which the chip is ready for being fed from the chip receiving member 58 to the chip fitting mechanism 3. At this time, the stopper 59 of the chip receiving member 58 is retracted downward by rotation and the holding arm 61 is released from the engagement with the upward pushing lever 63, so that the chip in the receiving member 58 is released therefrom.

When the feeding of the chip from the receiving member 58 to the chip fitting mechanism 3 is completed, the drive cylinder is actuated to be moved, during which the stopper ring 76b is abutted against the front end surface of the slide housing 77 to stop the horizontal movement of the receiving member 58 and base plate 74. The drive cylinder 71 is further actuated to be backward moved forward or retracted, so that the oscillating plate 67 is abutted against the stopper 73b of the vertical plate 68. Such abutment of the oscillating plate 67 against the stopper 73b allows the chip receiving member 58 to return to the original inclined position and be aligned with the chute 12. Subsequently, in the chute 12, the clamp 51 and the guide arm 56 are instantaneously actuated to release therefrom the chips received in the chute 12, so that the next lowermost chip may be fed to the chip receiving member 58 and held therein by means of the stopper 59 until a subsequent command is supplied to the drive cylinder 71.

Thus, it will be noted that the chip feed mechanism of FIGS. 7 to 14 individually and successively feeds special-type chips to the chip fitting mechanism at a high speed.

FIGS. 15 to 19 show another modification of the chip feed mechanism.

A chip feed and removing mechanism of FIGS. 15 to 19 is adapted to accomplish the accurate positioning of a chip irrespective of the variation in configuration and dimensions of chips as well as individually and successively feed chips to the chip fitting mechanism.

Same as the above-mentioned chip feed and removing mechanism 1 of FIGS. 3 to 14, the chip feed and removing mechanism of FIGS. 15 to 19 includes a plurality of cartridges 10 arranged in a row each carrying a plurality of magazines 100 therein each of which have special-type chips received therein, and a chip transfer device 2 arranged at the lower end of each of the cartridges 10. The cartridges 10 are also arranged in a manner to be inclined at an angle of about 45 degrees with respect to a horizontal plane of the body of the automatic mounting apparatus. The magazines 100 each are formed of a plastic material into a cylindrical shape and received in a manner to be superposed on one another at a predetermined posture in the cartridge 10. The cartridge 10 is provided on the front end surface thereof with a shutter 14 for opening and closing an opening formed at the distal end of each of the cartridges 10. The chip feed and removing mechanism also includes a chute 12 positioned at the lower portion of the front end surface of each of the cartridges 10. The chutes 12 each are fixed to the cartridge 10 and constitute a passage inclined at an angle of about 45 degrees and communicated with the corresponding cartridge 10. Above the passage formed by the chute 12 is arranged a chute stopper 79, which is fixed on a slider 80 adapted to be moved with respect to the front end surface of the cartridge 10. The slider 80 is biased downward by a spring 81 and provided at the lower end thereof with a roller 82.

The chip transfer device 2 each includes a chip holder 83 provided to be connectable to the distal end of each of the chutes 12. Each of the chip transfer devices is constructed as described below.

The chip holder 83 is pivotally mounted on a support plate 84 by means of a pivot pin 85 and is integrally provided with a chip receiving means 86 which is adapted to be contiguous to the chip passage of the chute 12 when the chip holder 83 is connected to the chute. On the chip holder 83 is pivotally mounted a lever 87 for a positioning stopper 88 by means of a pin 89. The positioning stopper 88 is integrally provided at the distal end of the lever 87 so as to contact with terminal pins 90 of a chip E on the chip receiving means 86 to regulate the position of the chip E. Also, the lever 87 has a bolt 91 fixed on the rear end thereof which is adapted to be abutted against the lower surface of the chute 12 when the chip holder 83 is connected to the chute 12. Further, the chip transfer device 2 includes a small-sized air cylinder 92 disposed above the chip holder 83 and a chip clamp 93 pivotally mounted on the chip holder 83 by means of a pin 94 and engaged with a lever 95 moved with the air-cylinder 92. Furthermore, the chip transfer device includes a holder stopper 96 mounted on the vertical support plate 84 which is adapted to horizontally hold the chip holder 83 when the chip holder 83 is released from the chute 12, and another air cylinder 97 arranged on a base (not shown) to pivotally move the chip holder 83 about the pin 89.

The manner of operation of the chip feed and removing mechanism of FIGS. 15 to 19 constructed as described above will be described hereinafter.

Figure 17:
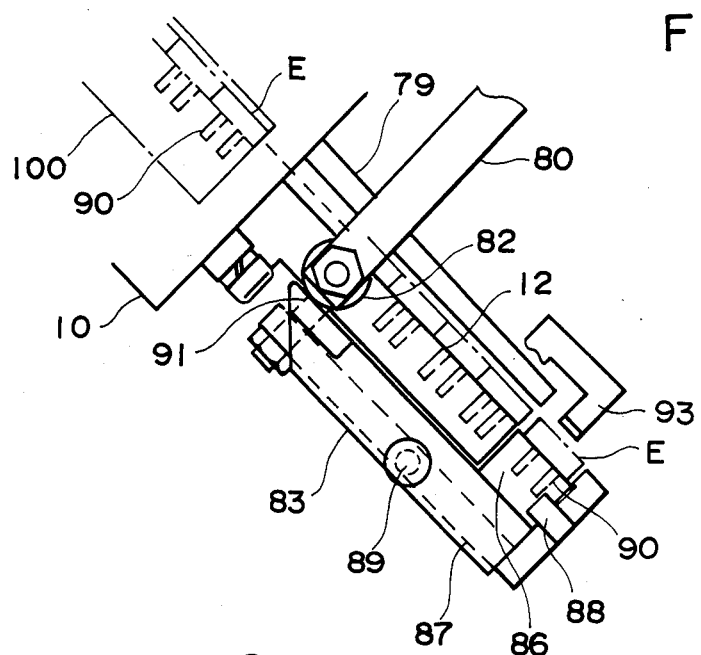
FIGS. 17 to 19 each are a fragmentary side elevation view of the essential part of the chip feed and removing mechanism of FIG. 15 showing the operation of the mechanism.

First, supposing that the air cylinder 97 is in a state of reducing the stroke thereof, so that the chip holder 83 may be inclined at an angle of about 45 degrees with respect to the horizontal plane and connected to the chute 12 as shown in FIG. 17; the roller 82 mounted on the lower end of the slider 80 is abutted against the upper surface of the chip holder 83 to be pushed upward. Thus, the chute stopper 79 is at the raised position or stopper releasing position. Also, the bolt 91 mounted on the rear end of the lever 87 is abutted against the lower surface of the chute 12, resulting in the positioning stopper 88 being positioned to engage the terminal pins 90 of the special-type chip E and prevent it from further descent. Also, the small-sized air cylinder 92 is in a non-actuated state, so that the tip end of the chip clamp 93 is at the raised position or non-clamping position.

Figure 18:
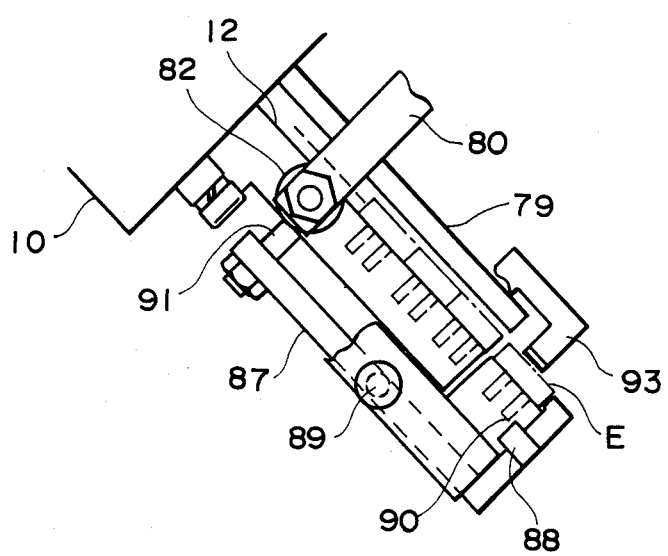

In the state described above, when one of the shutters 14 is opened in response to a command supplied thereto, special-type chips E received in the corresponding magazine 100 slip down on the chute 12 by gravity and the lowermost one of the chips E reaches the chip receiving means 86 of the chip holder 83. At this time, the terminal pins 90 of the chip E fed to the chip receiving means 86 is abutted against the positioning stopper 88 to allow the chip E to be arranged in position on the chip receiving means 86. Then, the small-sized air cylinder 92 is actuated to cause the chip clamp 93 to be rotated through the lever 95 in the counterclockwise direction in FIG. 16. This results in the chip E on the chip receiving means 86 being held by the chip clamp 93, as shown in FIG. 18.

Figure 19:
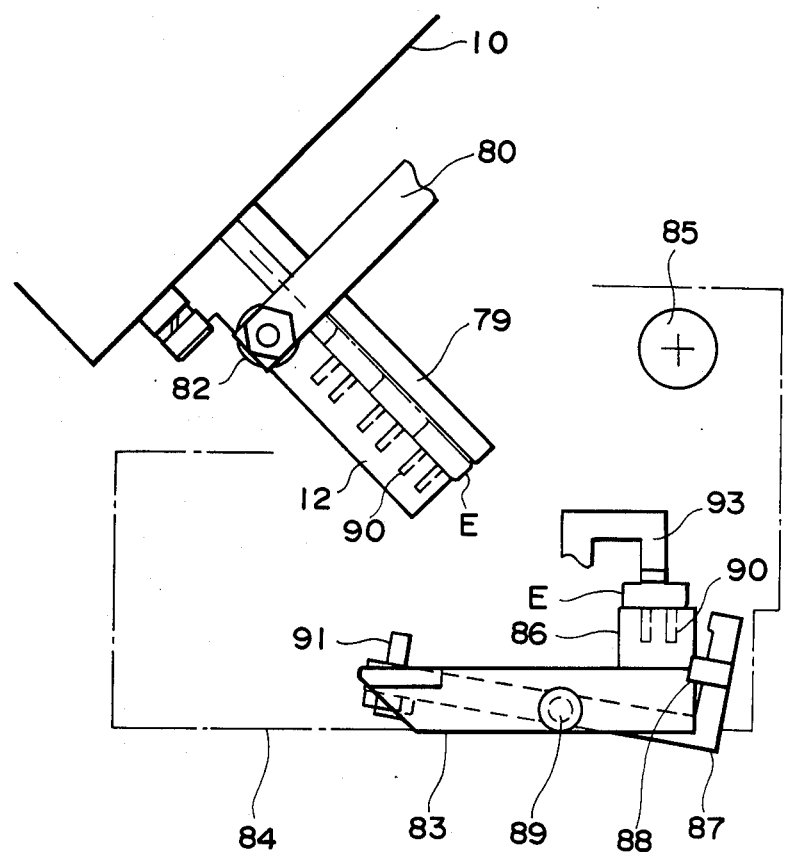
Figure 20:
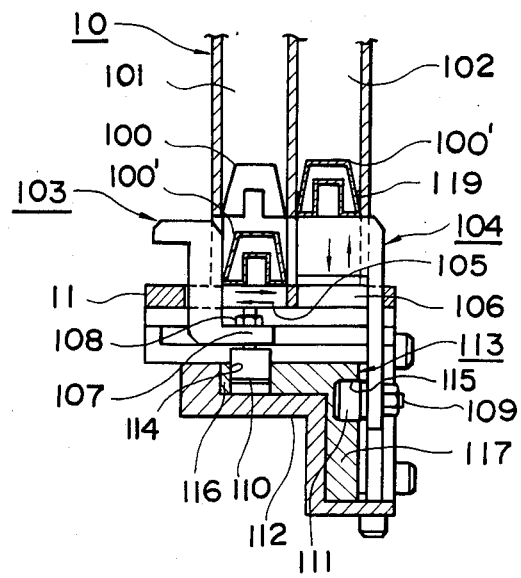
FIG. 20 is a partially cutaway front elevation view showing a device for automatically replacing magazines.

Then, when the air cylinder 97 is actuated to extend its rod, the chip holder 83, as shown in FIG. 19, is rotated in the counterclockwise direction about the pin 85 to be released from the chute 12, to thereby be in a horizontal state. At this time, the slider 80 is moved by the spring 81 and the chute stopper 79 serves to prevent chips on the chute 12 from moving thereon. Also, the tip end of the bolt 91 of the chip holder 83 is separated from the chute 12, so that the lever 87 may be rotated in the direction of lowering the distal end thereof by a spring (not shown); thus, the chip may be released from the constraint on the chip receiving means 86. Thereafter, the chip being held by the clamp 93 is released from clamp 93 due to the actuation of the air cylinder 92. The chip E on the chip receiving means 86 of the holder 83 is, thus, transferred to the chip fitting mechanism 3 by the actuation of the air cylinder 97.

When the chip is transferred to the chip fitting mechanism 3, the chip holder 83 is moved to the chute 12 by the actuation of the air cylinder 97 and connected to the chute 12 while being inclined, as shown in FIG. 17, and then receives the next chip.

Thus, it will be noted that the chip feed and removing mechanism of FIGS. 15 to 19 effectively accomplishes the accurate positioning of a chip as well as individually and successively feeds chips from the cartridges to the chip fitting mechanism 3.

Figure 21:
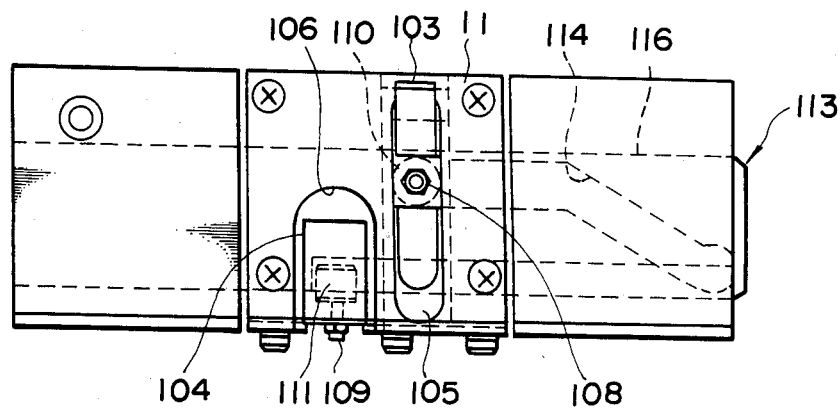
FIG. 21 is a plan view of the automatic replacing device shown in FIG. 20 and taken perpendicular to the plane of FIG. 20.
Figure 22:
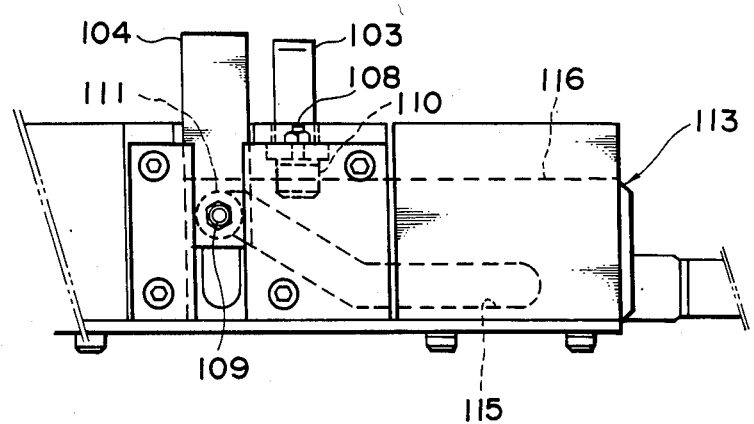
FIG. 22 is a fragmentary side elevation view of the automatic replacing device shown in FIG. 20.
Figure 23:
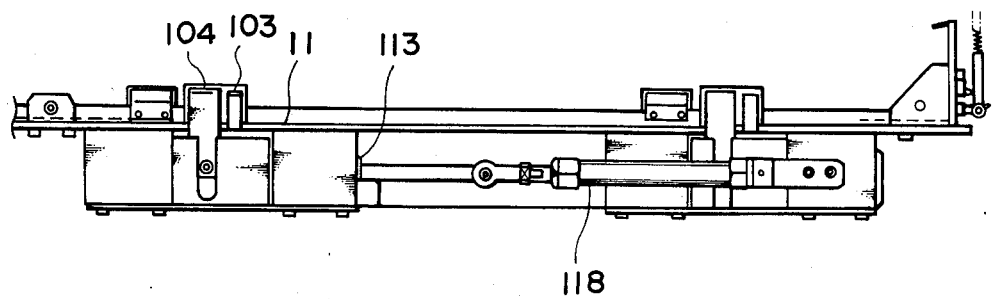
FIG. 23 is a side elevation view like that of FIG. 22 showing a driving mechanism for the automatic replacing device shown in FIG. 20.

The chip feed and removing mechanism 1, which described above, may include a device for automatically replacing magazines which is constructed in a manner such that empty magazines in each of the cartridges 10 are automatically replaced with chip filled magazines to individually and successively feed chips at a high speed. Such an automatic replacing device may be constructed in such a manner as shown in FIGS. 20 to 23. More particularly, the automatic replacing device includes stock, or storage, chambers 101 and 102 formed by separating the interior of each of the cartridges 10 into two spaces. The stock chamber 101 is adapted to receive a plurality of chip charged magazines 100 therein in a manner to be vertically stacked together in a row, and the stock chamber 102 is adapted to receive empty magazines 100' therein in order. The stock chambers 101 and 102 each are opened at the lower end thereof and are formed with a notch at the lower portion of the wall thereof to allow pushers 103 and 104 to be moved therein which are provided to project upward through the base 11. The pushers 103 and 104 are formed into substantially an inverted L-shape when viewed from the front side thereof and adapted to carry out a predetermined action in a passage through which the magazines are moved. More particularly, the pusher 103 is laterally movable with respect to the cartridge 10 along a laterally extending slit 105 formed at the base 11 and the pusher 104 is vertically movable via a cutout 106 (FIG. 20) formed at the base 11. The lateral pusher 103 has a cam follower 110 mounted on the lower horizontal portion 107 thereof through a vertical pin 108 and the vertical pusher 104 has a cam follower 111 mounted on the lower vertical portion thereof through a lateral pin 109. The cam followers 110 and 111 ride in grooves 114 (FIG. 21) and 115 (FIG. 22) formed at a slide plate 113 which is slidably supported on a guide frame 112. The slide plate 113 comprises a horizontal plate section 116 and a vertical plate section 117 which are formed together into substantially an inverted L-shape. The cam groove 114 in which the cam follower 110 is received is formed at the horizontal plate section 116 and the cam groove 115 engaged with the cam follower 111 is formed at the vertical plate section 117. The cam grooves 114 and 115 are formed into substantially a doglegged shape as shown in FIGS. 21 and 22 and adapted to respectively actuate the pushers 103 and 104 in different manners by moving the slide plate 113 at a predetermined stroke by means of a single drive cylinder 118.

The manner of operation of the automatic magazine replacing device constructed as described above will be described hereinafter with reference to FIGS. 20 to 23.

When chips are removed from lowermost one of the magazines 100 received in the stock chamber 101 to render the magazine empty, the drive cylinder 118 is actuated to change the stroke in response to a finish indicating command from a detector such as a phototube, to thereby cause the pushers 103 and 104 to carry out their predetermined operation. More particularly, when the drive cylinder 118 is actuated to extend the stroke, the slide plate 113 is moved to cause the slanting portion of the cam groove 115 formed at the vertical plate section 117 to act on the cam follower 111, so that the pusher 104 upward projecting from the base 11 may be moved downward through the cutout 106 of the base 11 below the base. During the downward motion of pusher 104, the pusher 103 remains stationary at the position laterally away from the notch of the stock chamber 101 irrespective of the movement of the slide plate 113, because the cam follower 110 rides in the portion of the cam groove 114 formed at the horizontal plate section 116 of the slide plate which lies parallel to the movement of the slide plate 113. As the slide plate 113 is moved further the cam follower 110 enters the inclined portion of the cam groove 114. As a result, the pusher 103 is moved laterally to transfer the newly empty magazine 100' (see below for discussion of how it got there) along the base 11 to the position right below the stock chamber 102. During lateral movement of pusher 103, the pusher 104 remains stationary under the base 11 because the cam follower 111 rides in the portion of the cam groove 115 which is parallel to the direction of movement of slide plate 113. When the pusher 103 transfers the empty magazine 100' to the position above the pusher 104, the drive cylinder 118 is actuated to retract the stroke. This causes the pusher 103 to leave the empty magazine 100' at the position above the pusher 104 and be returned toward its origonal position when this movement is completed, the pusher 104 is upwardmoved to lift the empty magazine 100'. This results in the empty magazine 100' being forced upward and inserted into the stock chamber 102 for recovery. magazine The normal position of the various just-described elements is attained when slide plate 113 is moved to the left-most position (as viewed in FIGS. 21 and 22) with the extension of drive cylinder 118. As a result of its being so positioned, pusher 103 sits below chamber 101 and supports the stack of full cartridges above it. Meanwhile, pusher 104 is in its lowest position below chamber 102 with the stack of empty cartridges 100' being supported by leaf spring 119. When the newly-emptied status of a cartridge in chamber 101 is detected, drive cylinder 118 is retracted to move slide plate 113 to the right (as viewed in FIGS. 21 and 22). Consequently, pusher 103 moves out of chamber 101 letting the newly emptied magazine 100' drop to the base 11. The remaining full cartridges rest on top of this newly emptied magazines. Thereafter, pusher 104 ascends to raise the empty cartridge 100' previously below chamber 102 to a position above leaf spring 119. As drive cylinder 118 extends again, pusher 104 drops and then pusher 103 moves newly emptied magazine 100' into the just-vacated area below chamber 102. The stack of full magazines is carried by the upper part of pusher 103 as it moves empty magazine 100' out of chamber 101, so that the requisite bottom support for the stack of full magazine is always provided by pusher 103 or by an empty magazine. When the magazine used is formed to substantially extend in the longitudinal direction, two or more pairs of the lateral feeding pushers 103 and upward feeding pushers 104 may be provided to be spaced from ech other in the longitudinal direction of the magazine and concurrently actuated by the drive cylinder 118.

The chip fitting mechanism 3 includes a single mounting head 30 schematically shown in FIG. 2 and shown in detail in FIGS. 24 to 30. The chip fitting mechanism 3 is adapted to be moved between the forward position of movement of each transfer device and the fitting position of a chip onto the substrate P by means of an X-Y table 300. For this purpose, the chip fitting mechanism 3 as shown in FIG. 2, is mounted on the X-Y table 300 through a support frame 17 of which the movement is guided by guide bars 18 and 19 arranged in the X-Y direction. The mounting head 30 is adapted to be vertically moved to receive a chip from each of the chip transfer devices and mount it on the substrate P.

The mounting head 30, as shown in FIGS. 24 to 27, has a pair of guide arms 31 and 32 mounted on both sides of the lower portion thereof to hold a chip E therebetween. The guide arms 31 and 32 comprise lower arm members 31a and 32a of a spatula-like shape to allow the chip E to be held therebetween and upper arm member 31b and 32b, respectively. The lower arm members 31a and 32a are detachably supported on the lower portions of the upper arm members 31b and 32b by means of screws 301 and 302, respectively. This allows the guide arms to readily handle various types of special-type chips different in configuration only by replacing the lower arm members 31a and 32a. The upper arm members 31b and 32b are pivotally mounted on a support frame 33 by means of a pins 303 and 304 to open and close the lower ends of the lower arm members 31a and 32a about the pin 303 and 304, respectively. The upper arm members 31b and 32b are connected through cylinder rods 305 and 306 to small-sized drive cylinders 34 and 35 mounted on the support frame 33, respectively. The drive cylinders 34 and 35 are actuated to close the lower ends of the guide arms 31 and 32 to hold the chip E therebetween. Also, the upper arm members 31b and 32b have upper adjusting bolts 307 and 307' and lower adjusting bolts 308 and 308' with the pins 303 and 304 positionally interposed therebetween, which serve to adjust the opening and closing operation of the guide arms 31 and 32. The adjusting bolts are threadedly fixed on bracket plates 309 and 310 mounted on the support frame 33 in a manner such that the tip ends thereof are inserted into or abutted against the guide arms 31 and 32. The upper adjusting bolts 307 and 307' serve to regulate the closing movement of the guide arms 31 and 32 and, for this purpose, compression springs 311 are fitted on the bolts 307 and 307' to restrain the lower arm members 31a and 32a from being biased in the closing direction. On the contrary, the lower adjusting bolts 308 and 308' are adapted to cause the tip ends thereof to abut against the guide arms 31 and 32 to regulate the closing position of the guide arms.

Figure 24:
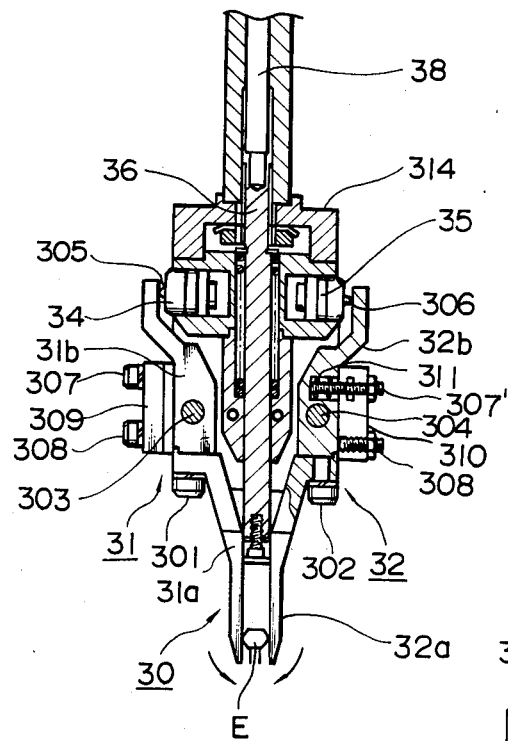
FIG. 24 is a side elevation view partly in section showing a mounting head of chip fitting mechanism incorporated in the automatic mounting apparatus shown in FIG. 2.
Figure 25:
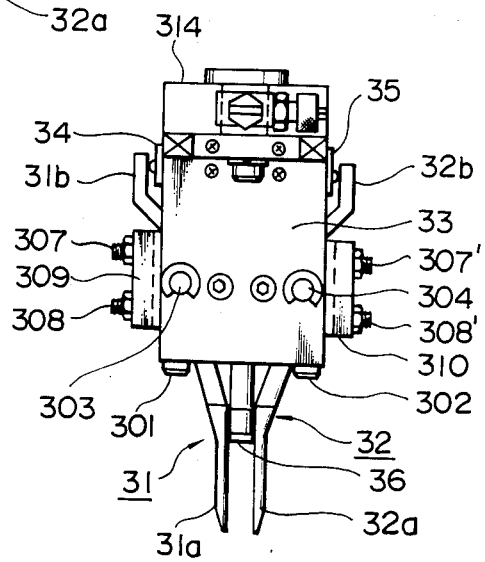
FIG. 25 is an enlarged front elevation view of the mounting head shown in FIG. 24.
Figure 26:
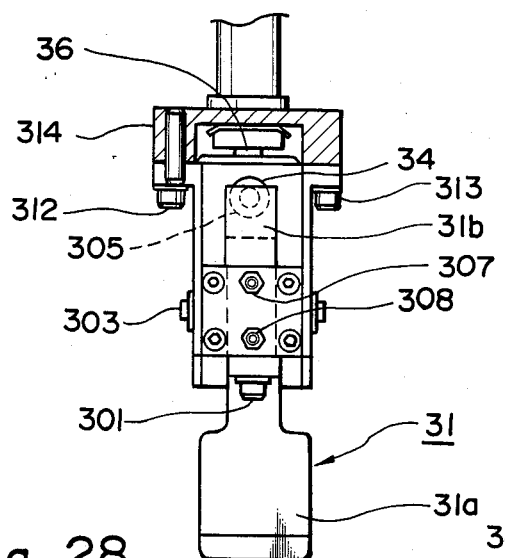
FIG. 26 is a side elevation view partly in section of the mounting head shown in FIG. 25.
Figure 27:
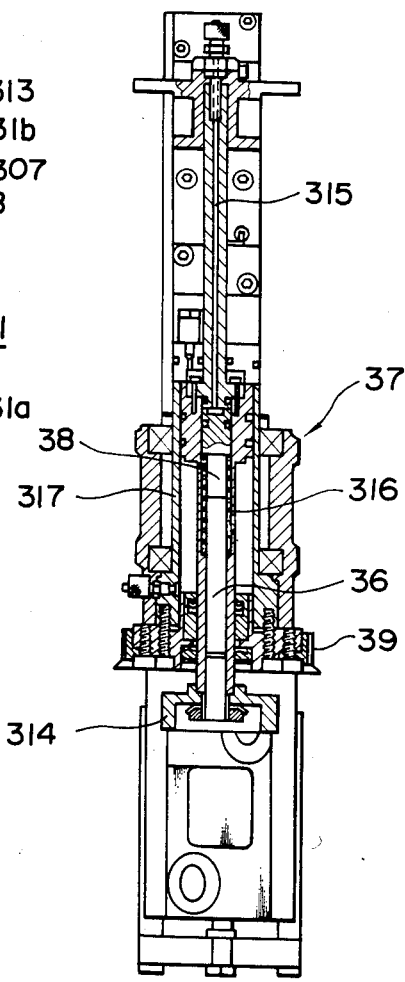
FIG. 27 is a vertical sectional side elevation view showing a chip fitting mechanism having the mounting head of FIG. 24 mounted thereon.

Between the guide arms 31 and 32 is vertically movably arranged a push rod 36, as shown in FIGS. 24 and 27. The push rod 36 is connected to a head body 37 of the mounting head 30 which has the guide arms 31 and 32 mounted thereon through the support frame 33. The head body 37 has a double-cylinder structure and the guide arms 31 and 32 are mounted on the head body 37 through a cup ring 314 on which the support frame 33 is mounted by means of bolts 312 and 313. The push rod 36 is connected to a vertically movable rod 38 which is vertically moved by air pressure applied to an air passage 315, and adapted to be vertically moved by a compression spring 316 fitted thereon. The head body 37 includes a cylinder 317 having the push rod 36 contained therein, so that the guide arms 31 and 32 may be vertically moved during the chip mounting operation, independently from the vertical movement of the push rod 36. Further, the head body 37 is connected to a pulley 39 through a pulse motor and a belt (not shown), to thereby allow the direction of the chip E held between the guide arms 31 and 32 to be changed as desired.

Figure 28:
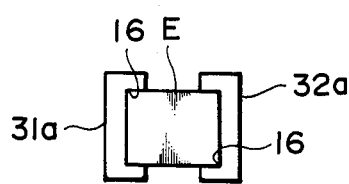
FIG. 28 is a schematic plan view showing a modification of guide arms used in the chip fitting mechanism shown in FIG. 27.

The guide arms 31 and 32 may be formed at the lower ends thereof into a shape as shown in FIG. 28. More particularly, the lower ends of the lower arm members 31a and 32a of the guide arms 31 and 32 are formed on the inner surface thereof opposite to each other with grooves 16 which have a shape to receive the side portion of a chip E. Such configuration of the guide arms 31 and 32 allows the chip to be positively held therebetween. The lower arm members 31a and 32a of the guide arms may be removably mounted on the upper arm members 31b and 32b through the screws 301 and 302.

Figure 29:
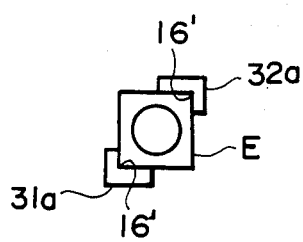
FIG. 29 is a schematic plan view showing another modification of guide arms in the chip fitting mechanism shown in FIG. 27.

Alternatively, the lower ends of the lower arm members 31a and 32a of the guide arms may be formed into substantially an L-shape as shown in FIG. 29 so as to interposedly hold a chip E therebetween through the corners of the chip. The lower arm members 31a and 32a are preferably exchangeably, i.e. replaceably mounted.

Figure 30:
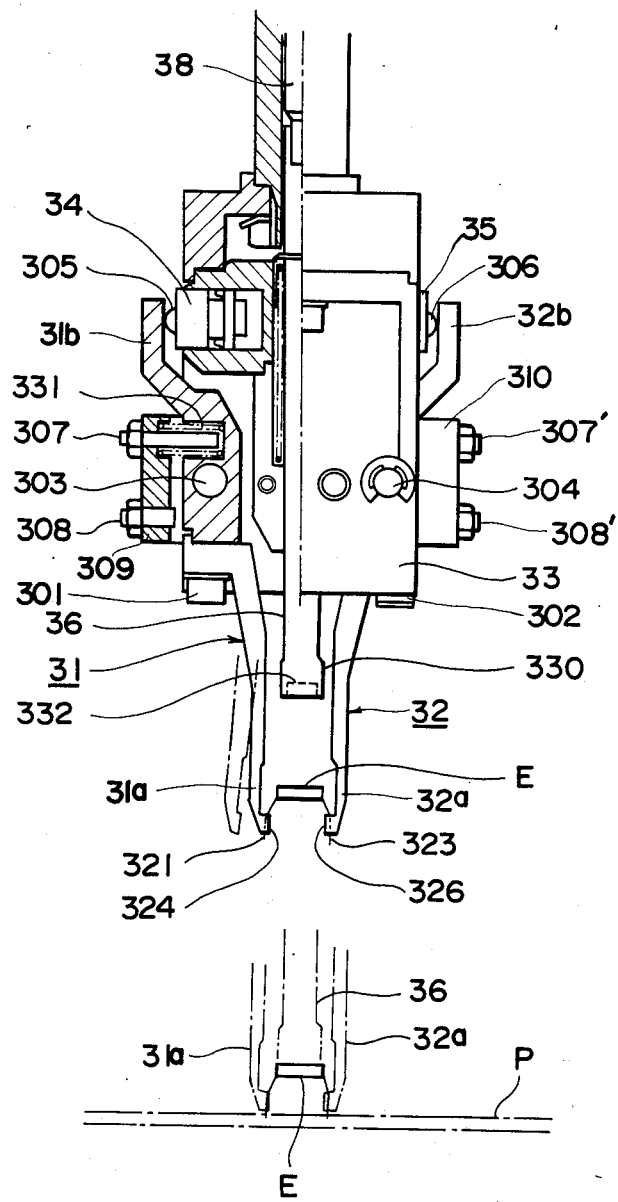
FIG. 30 is a front elevation view partly in section showing a modification of the chip fitting mechanism shown in FIG. 24.
Figure 31:
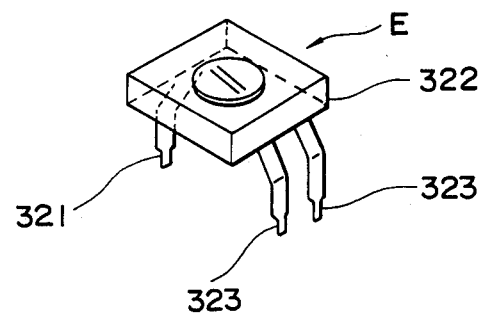
FIG. 31 is a perspective view showing one example of a special-type chip suitable to be treated by the chip fitting mechanism shown in FIG. 30.
Figure 32A:
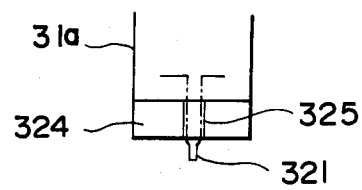
FIGS. 32A and 32B each are schematic side views showing configuration of the inner surface of the lower portion of each of guide arms used in the chip fitting mechanism shown in FIG. 30.
Figure 32B:
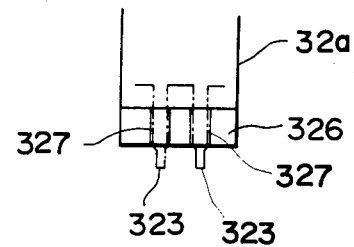
Figure 36:
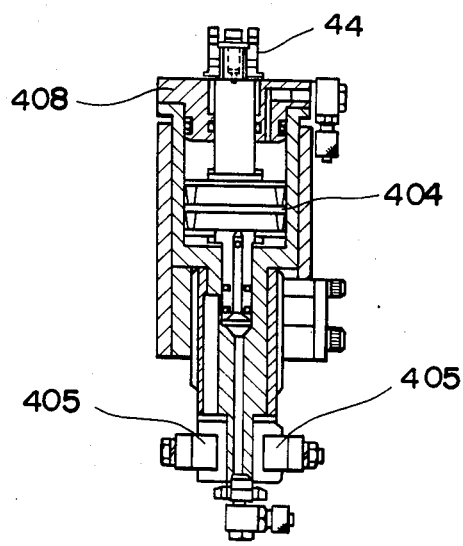
FIG. 36 is a vertical sectional view of the chip clinching mechanism shown in FIG. 35.
Figure 37:
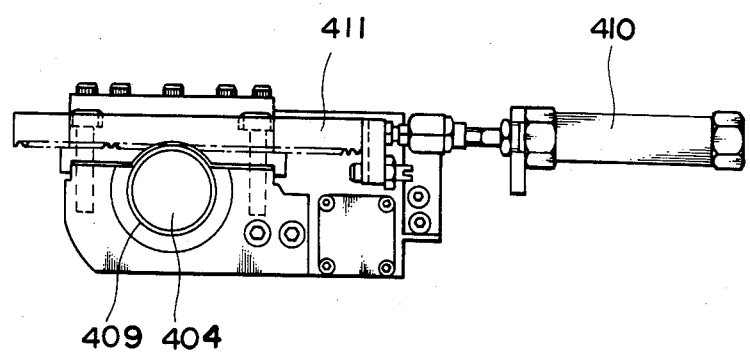
FIG. 37 is a plan view showing the chip clinching mechanism of FIG. 35 which includes means for turning a chip.

FIG. 30 illustrates a modification of the chip fitting mechanism 3 described above. A chip fitting mechanism shown in FIG. 30 is adapted to mount an inverted-type semifixed resistor E. Various sites and shapes can be used for resistor E, one example of which is schematically shown in FIG. 1. It is shown in greater detail by FIG. 31. The chip E shown in FIG. 31 comprises a chip body 322, and a first lead terminal or terminal pin 321 downward extending one side of the chip body 322 and two second lead terminals or terminal pins 323 downwardextending from the opposite side thereof. The chip fitting mechanism of FIG. 30 has a pair of guide arms 31 and 32 formed to correspond to such configuration of the chip E. More particularly, the guide arms 31 and 32 comprises lower arm members 31a and 32a, and upper arm members 31b and 32b. The lower arm member 31a is formed on the inner surface 324 of the lower portion thereof with a single groove 325 for receiving and positioning the first lead terminal 321 of the chip E therein, as shown in FIG. 32A. Also, the lower arm member 32a is formed on the surface 326 opposite to the surface 324 of the lower arm member 31a with two grooves 327 for receiving and positioning the second lead terminals 323. Between the guide arms 31 and 32 is movably arranged a push rod 36 for vertical movement, as shown in FIG. 30. The push rod 36 is provided at the central portion of the lower end 330 thereof with a recess 332 having a shape corresponding to that of the chip body 322 of chip E. The remaining part of the chip fitting mechanism of FIG. 30 is constructed in substantially the same manner as that shown in FIGS. 24 to 27.

In the chip fitting mechanism of FIG. 30, a pair of the guide arms 31 and 32 are closed due to the actuation of air cylinders 34 and 35 to hold the chip or resistor E therebetween. At this time, the lead terminal 321 and lead terminals 323 are received and positioned in the groove 325 of the lower arm member 31a and the grooves 327 of the lower arm member 32a, respectively. Subsequently, the guide arms 31 and 32 are downward-moved to insert the lead terminals 321 and 323 into holes of a substrate P for a printed circuit board, as indicated by phantom lines in FIG. 30. Then, the push rod 36 is lowered to downwardpress the chip body 322 and the guide arms 31 and 32 are opened. Thereafter, the push rod 36 is further lowered to complete the insertion of the lead terminals 321 and 323 into the substrate P.

The automatic mounting apparatus of the illustrated embodiment also includes the chip terminal clinching mechanism 4 described above which is arranged below a substrate P on the conveyor 5 with respect to the chip fitting mechanism 3, as described above. The chip terminal clinching mechanism 4, as shown in FIG. 2, is supported by a guide bar 40 inserted through the support frame 17 of the chip fitting mechanism 3 and is moved to a predetermined position by means of the X-Y table 300 with the movement of the chip fitting mechanism 3. Also, the chip clinching mechanism 4, as shown in FIGS. 33 to 37, includes a pair of benders 41 and 42 arranged to be spaced from each other at a distance sufficient to receive therebetween lead terminals e of a chip E fitted in a substrate P by means of the mounting head 30. The benders 41 and 42 are adapted to cut the lead terminals e into a predetermined length and forcibly bend the lead terminals along the lower surface of the substrate P by moving the upper ends of the benders to each other. The benders 41 and 42 are pivotally supported at the intermediate portions thereof on a support frame 43 by means of bolts 401 and 402, respectively, and insulators 414 and 415 are arranged below the pivotally supported portions of the benders 41 and 42. A tension spring 403 is stretched between the insulators 414 and 415 to cause the upper portions of the benders to be kept open. The chip terminal clinching mechanism 4 also includes cam means 44 mounted on a clinching body 45 so as to carry out the operation of squeezing itself into a space formed between the lower portions of the benders 41 and 42. The cam means 44 is arranged to project toward the upper end side of a rod of a lead terminal cutting and clinching cylinder 404 to be vertically moved due to the actuation of the cylinder 404. The lead terminal cutting and clinching cylinder 404 is connected through a lever 406 (FIG. 35) pivotally mounted on a frame 405 to a drive cylinder 407, so that the actuation of the cylinder 407 may cause the whole cylinder 404 to be vertically moved.

The benders 41 and 42 are fixed on the upper end side of the chip cutting and clinching cylinder 404 by connecting the support frame 43 to a cap 408 of the cylinder 404. Also, a pinion 409 formed on the outer periphery of the cylinder 404 is engaged with a rack 411 mounted on the distal end of a rod of a drive cylinder 410 to cause the benders 41 and 42 to be turned by an angle of 90 degrees due to the actuation of the drive cylinder 410 depending upon the position of the inserted lead terminals. The cam means 44 comprises a spacer section 412 acting to keep the gap between the upper ends of the benders 41 and 42 constant and a pressing section 413 of a shape obliquely downward expanded from the spacer section 412. The pressing section 413 is adapted to act on the insulators 414 and 415 below the pivotally supported portions of the benders 41 and 42 to approach the upper ends of the benders to each other, to thereby allow the upper ends of the benders 41 and 42 to bend the lead terminals e of the chip E.

The chip terminal clinching mechanism 4 may include a detection device which is adapted to confirm the mounting of a chip on a substrate. The detection device may be constructed in a manner to mount on the cam means 44 a terminal 416 constituting one of electrodes for a detection circuit and insert a terminal 417 forming the other electrode into one of the insulators 414 and 415 against which the cam means 44 is abutted. Also, the detection device includes a detection pin 418 which is adapted to be releasably abutted against the terminal 417. The detection pin 418 is arranged to project from the insulator 414 toward the cam means 44 by means of a compression spring 419 so that it may be abutted against the terminal 417 only when the terminal pins e of the chip E are interposed between the benders 41 and 42. The other insulator 414 has a positioning pin 420 inserted thereinto to be inward projected therefrom which is adapted to allow the benders 41 and 42 to bend the terminal pins e of the chip E in synchronism with each other.

Now, the automatic mounting apparatus of the illustrated embodiment constructed in the manner described above will be described hereinafter with reference to FIGS. 2 to 6, 20 to 27, and 33 to 37.

Generally speaking, one of chips E individually and progressively fed from the magazine 100 is horizontally extracted by the clamp 20 of the chip transfer device. Then, the chip is picked up by the mounting head 30 of the chip fitting mechanism 3 moved to the forward moving position of the clamp 20 of the chip transfer device 2 by the X-Y table 300. Then, the chip is positioned on a substrate P by fitting the lead terminals of the chip in holes of the substrate P and the terminal pins are subjected to the cutting and bending treatment using the chip terminal clinching mechanism 4. During the operation, the chips successively slipping down from the cartridges 10 through the chutes 12 are stopped by the stoppers 13.

When chips are clamped by the clamp 20 of the chip transfer device 2 and horizontally removed, resulting in the lowermost magazine 100 received in the cartridge 10 being empty, the automatic replacing device causes the next magazine charged with chips to be moved to the lowermost position in the cartridge 10, so that the chips may be successively fed.

Each chip transfer device 2 is adapted to extract chips from the cartridge 10 by the clamp 20 thereof and move the clamp 20 to a predetermined position in the horizontal direction by means of the drive cylinder 25. More particularly, when a chip slips down from the magazine 100 of the cartridge 10 onto the chute 12 and is held by the stopper 13, the drive cylinder 21 is actuated to operate the holding member 20b of the clamp 20 to clamp the chip positioned on the chute 12. Concurrently, the drive cylinder 25 is actuated to extend its rod to move the clamp 20 toward the mounting head 30 of the chip fitting mechanism 3. At the initial stage of such forward movement, the cam plate 24 gradually slides within the support frame 28 against the tension spring 27 to rotate the support plate 22 from the inclined position to the horizontal position while gradually lowering it, so that the chip E may be removed from the chute 12 by the clamp 20 of which the jaw member 20a and holding arm 20b hold it therebetween. At this time, the stopper 13 is biased downwardly to be released from the chip and the shutter 14 is downwardmoved to prevent the next chip from slipping down onto the chute 12. When the clamp 20 removes the chip from the chute 12, the support plate 22 is rendered substantially horizontal in the support frame 28 and the cam plate 24 is moved to the forward position within the range of sliding movement of the support frame 28. When the forward movement of the cam plate 24 within the support frame 28 is completed, the support frame 28 is forwardmoved with the cam plate 24 to cause the clamp 20 to be moved to the waiting position of the mounting head 30 while horizontally holding the chip between the jaw member 20a and holding arm 20b thereof. When the clamp 20 reaches the waiting position of the mounting head 30, the stopper 203 of the guide bar 29 is brought into abutment against the slide housing 201 and the holding arm 20b is vertically actuated to release the chip from the holding of the clamp 20 due to the actuation of the drive cylinder 21. Then, the chip is transferred to the mounting head 30 from the clamp 20. When the chip is transferred to the mounting head 30, the drive cylinder 25 is immediately actuated to retract its rod to cause the stopper 202 to be abutted against the slided housing 201. Thereafter, the cam plate 24 is moved within the support frame 28 by means of the tension spring 27 and stopped when the stopper 204 is abutted against the body 26. At this time, in the chip feed and removing mechanism 1, the shutter 14 is upwardmoved to allow the next chip to slip down onto the chute 12, which is held by the clamp 20 until the drive cylinder 25 receives a command. When the guide arms 31 and 32 of the mounting head 30 hold the chip therebetween, the X-Y table 30 transfers the mounting head 30 to the position of a substrate P and the cylinder 317 of the mounting head 30 is actuated to move the mounting head 30 to the substrate P. Such downward movement of the mounting head 30 is carried out to the position at which the terminal pins of the chip are abutted against the surface of the substrate P, and then the push rod 36 is lowered together with the vertically moving rod 38 due to air pressure applied to the air passage 315. The push rod 36 forces the chip interposed between the arms 31 and 32 to against the substrate insert the terminal pins of the chip into the holes of the substrate P. After the terminal pins are inserted into the substrate, the guide arms 31 and 32 which hold the chip between the lower ends thereof are moved to open by the action of the compression spring 311 when the drive cylinders 34 and 35 are actuated. The chip which is now mounted on the substrate P is then subjected to the operation of cutting and clinching the terminal pins of the chip by means of the chip terminal clinching mechanism 4 arranged under the substrate, and concurrently, when the air pressure is released, the push rod 36 is upward moved by the force of the compression spring 316 and the chip fitting mechanism 3 is immediately moved to the position at which the clamp 20 of the chip transfer device 2 may carry out the forward movement in response to a commansd supplied according to the next program.

In the chip terminal clinching mechanism 4, when the terminal pins of the chip E are inserted into the substrate P by the fitting mechanism 3, the drive cylinder 407 is synchronously actuated to cause the cylinder 404 to be upward moved as a whole through the lever 406. With the upward movement of the cylinder 404, the benders 41 and 42 are also upward moved to receive the terminal pins of the chip in the space formed between the upper ends thereof opened. Concurrently, the terminal cutting and clinching cylinder 404 is actuated to cause the cam means 44 to squeeze itself between the benders 41 and 42, so that the upper ends of the benders 41 and 42 may approach to each other. This results in the upper ends of the benders 41 and 42 cutting the terminal pins into a desired length and bending the pins along the lower surface of the substrate P, during which reaction force is applied from terminal pins to the upper ends of the benders 41 and 42, so that the detection pin 418 forced by the cam means 44 may be biased to be contacted with the terminal 417 against the compression spring 419. When the detection pin 418 is contacted with the terminal 417, the insertion detecting circuit formed between the terminal 417 and the terminal 416 of the cam means 44 is closed to confirm the insertion of the terminal pins of the chip into the substrate P. On the other hand, when a failure in insertion of the terminal pins of the chip into the substrate occurs, the reaction force is not generated, so that the benders 41 and 42 are idly operated and the compression spring 419 acts to keep the detection pin 418 at a projected state. Accordingly, the detection pin 418 fails to be contacted with the terminal 417, resulting in the detection circuit being kept open to confirm a failure in the insertion.

Thus, it will be noted that the automatic mounting apparatus of the present invention individually and successively accomplishes the mounting of various kinds of special-type chips on a substrate for a printed circuit board with high efficiency and at a high speed, because chips fed from the cartridges are individually and successively removed to the waiting position of the chip fitting mechanism by means of the chip transfer device according to a predetermined program and then picked up by the mounting head of the chip fitting mechanism moved to a predetermined position by the X-Y table. Also, in the automatic mounting apparatus of the present invention, the push rod forces a chip to a substrate, so that the insertion of terminal pins of the chip into the substrate may be effectively carried out.

It will thus be seen that the objects set forth above, among those made apparent from the preceding description, are efficiently attained and, since certain changes may be made in the above construction without departing from the spirit and scope of the invention, it is intended that all matter contained in the above description as shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An apparatus for automatically mounting electronic components on a substrate comprising:
a support;
means fixed to said support for individually and successively feeding electronic components to a mounting means and including at least one cartridge obliquely arranged, said at least one cartridge including first storage means for carrying vertically stacked magazines adapted to store said electronic components therein, and second storage means laterally adjacent said first storage means for receiving empty vertically stacked magazines therein; a transfer means coupled to a lower end of said cartridge to receive an electronic component sliding out of said cartridge under the pull of gravity and being movable to transfer an electronic component to a predetermined position; and a stopper means mounted on said transfer means for stopping said electronic component being pulled down by gravity within the transfer means;

said mounting means comprising means carried on said support for reciving said electronic component from said feeding means and placing it on said substrate;

positioning means movably mounted on said support for moving at least one of said transfer means and said mounting means relative to the other to bring the electronic component from the cartridge to the mounting means;

a terminal clinching means carried on said support for cutting and bending terminal pins of said electronic component projecting from the bottom of said substrate; and a device carried on said support for automatically replacing a just-emptied magazine from the lowest position in the vertical stack of said magazine in the first storage means including a first pusher means carried on said support for laterally transferring an empty magazine from said first storage means to the second means, and a second pusher means carried on said support for vertically moving said empty magazine upward in said second storage means, said first and second pusher means being arranged below said cartridge.

2. An apparatus as defined in claim 1, wherein each of said transfer means includes a clamp means for receiving and holding electronic components slipping down from each of said magazines and stopped by said stopper means; a first support frame mounted to said support and arranged in a manner to be inclined corresponding to the inclination of each of said cartridges and on which said clamp means is mounted; a cam plate engaged through a cam follwer with said support frame; a reciprocating drive cylinder connected to said cam plate; a second support frame on which said cam plate is slidably held, said second support frame being arranged to be moved in the same direction as said drive cylinder by means of a guide bar fixed to said support; whereby the actuation of said drive cylinder moves said cam plate together with said second support frame to cause said cam follower to horizontally bias said first support frame, to thereby successively transfer electronic components held by said clamp means to said mounting head.

3. An apparatus as defined in claim 1, wherein said feeding means includes a chute arranged at an outlet of said cartridge to receive electronic components slipping down thereonto from said cartridge; a clamp means mounted on the side of said chute and adapted to secure said electronic components except the foremost one; and each of said transfer means including a base arranged in alignment with the lower end of said chute to receive only said foremost chip, said stopper means being mounted on the front surface of said base, and a holding arm releasably arranged on the side of said base to secure said electronic components; said positioning means moving said base from an inclined position to a horizontal position and also to a waiting position of said mounting means.

4. An apparatus as defined in claim 1, wherein said feeding means includes a chute provided to constitute a chip passage communicated with each of said cartridges; and each of said transfer means including a chip holder tiltably provided to receive therein an electronic component from said chute, clamping means for clamping an electronic component received in said chip holder, said stopper means positioning terminal pins of a special-type electronic component; said clamping means and said stopper means being mounted on said chip holder.

5. An apparatus as defined in claim 1, wherein said cartridges and chutes are inclined at an angle of about 45 degrees with respect to the horizontal plane.

6. An apparatus as defined in claim 1, wherein said first and second pusher means each includes a cam follower riding within a cam groove formed in a slide plate coupled to and reciprocated by a drive cylinder.

7. An apparatus as defined in claim 1, wherein said first and second pusher means each includes a cam follower riding within cam grooves which are different in shape and formed in a slide plate coupled to and reciprocated by a single drive cylinder.

8. An apparatus as defined in claim 1, wherein said mounting means comprises guide arms and drive means for operating lower ends of said guide arms; and a push rod arranged for vertical movement between said guide arms; one of said guide arms having a lower end portion formed with at least one groove for positioning at least one terminal pin extending downward from one side of an electronic component therein and he other guide arm having a lower end portion formed with at least one groove for positioning at least one terminal pin extending downward from the opposite side of said component therein.

9. An apparatus as defined in claim 1, wherein said terminal clinching means comprises a pair of bending means pivotally mounted on support means to be opposite to each other; cam means arraged to be squeezed between the lower ends of said bending means to cause the upper ends of said bending means to carry out at least the operation of bending terminal pins of an electronic component; a first terminal mounted on said cam means to act as one electrode and a second terminal mounted on the lower end of one of said bending means through an insulator to act as the other electrode; and a detection pin provided to be releasably contacted with said second terminal, said detection pin being elastically biased through said insulator toward said cam means to be abutted against said cam means when said cam means is at the squeezing position.

10. An apparatus as defined in claim 1, wherein said mounting means comprises a support frame; two guide arms with at least one being pivotally mounted on said support frame; a drive means connected to said guide arms to operate the lower end of the at least one of said guide arm; and a push rod mounted on said support frame for vertical movement and arranged between said guide arms to press an electronic component against said substrate.

11. An apparatus as defined in claim 1, wherein said first pusher means includes a horizontal surface and a vertical surface, said horizontal surface adapted to be positioned below, and to support, the vertical stack of magazines in the first storage means, and the vertical surface extends below the horizontal surface and is adapted to abut against a feeding magazine located in the lowest position in the vertical stack of magazines in the first storage means; and said second pusher means including a horizontal surface movable from a first position where it is lower than the feeding magazine, and a second position where it is higher than the feeding magazine; said device comprising a first opening communicating the first and second storage means through which the feeding magazine can pass laterally and a second opening in the first storage means opposite said first opening through which the first pusher means can pass; said first pusher means having a first position where it is outside the first storage means, and a second position into which it is placed by passing through the second opening as the vertical surface of the first pusher means laterally pushes a just-emptied feeding magazine into the second storage means through the first opening; said device further comprising control means to move, in sequence, the first pusher means to its first position to allow a magazine to be placed in said feeding magazine position and, when the feeding magazine is emptied, to place the first pusher means in its second position, and to place the second pusher means in its second position.

12. An apparatus as defined in claim 11, wherein said control means returns the first pusher means to its first position and the second pusher means to its first position.

13. An apparatus as defined in claim 12, wherein the second storage means includes retention means for holding the vertical stack of magazines therein when the second pusher means returns to its first position.

14. An apparatus as defined in claim 10, wherein said lower end of each of said guide arms has a shape engaged with the corner portion of an electronic component so that said component may be securely interposed as the opposite corners thereof between said lower ends of said guide arms.

15. An apparatus as defined in claim 14, wherein said guide arms each are removably mounted.

16. An apparatus as defined in claim 10, wherein said lower end of each of said guide arms is formed on the inner surface thereof with a groove for receiving the side portion of a special-type electronic component so that said component may be securely interposed at the opposite side portions thereof between said lower ends of said guide arms.

17. An apparatus as defined in claim 16, wherein said guide arms are removably mounted.

* * * * *